(12) United States Patent
Sambandan et al.

(10) Patent No.: US 8,207,663 B2
(45) Date of Patent: Jun. 26, 2012

(54) PHOSPHOR COMPOSITION AND LIGHT EMITTING DEVICE USING THE SAME

(75) Inventors: Ekambaram Sambandan, Carlsbad, CA (US); Bin Zhang, San Diego, CA (US); Rajesh Mukherjee, Irvine, CA (US); Toshitaka Nakamura, Osaka (JP); Hironaka Fujii, Carlsbad, CA (US)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/176,660

(22) Filed: Jul. 5, 2011

(65) Prior Publication Data

US 2012/0007494 A1    Jan. 12, 2012

Related U.S. Application Data

(60) Provisional application No. 61/363,148, filed on Jul. 9, 2010.

(51) Int. Cl.
*H05B 33/00* (2006.01)
*C09K 11/63* (2006.01)

(52) U.S. Cl. .. 313/503; 313/486; 313/512; 252/301.4 R; 252/301.6 R; 252/301.6 F

(58) Field of Classification Search ............ 313/503, 313/498, 485–487, 512; 252/301.6 R, 301.6 F, 252/301.4 R, 301.5, 301.6 P, 301.4 P
See application file for complete search history.

(56) References Cited

U.S. PATENT DOCUMENTS

| | | | |
|---|---|---|---|
| 5,998,925 A | 12/1999 | Shimizu et al. | |
| 6,069,440 A | 5/2000 | Shimizu et al. | |
| 6,085,971 A | 7/2000 | Tews et al. | |
| 6,093,346 A | 7/2000 | Xiao et al. | |
| 6,284,156 B1 | 9/2001 | Uehara et al. | |
| 6,649,946 B2 | 11/2003 | Bogner et al. | |
| 7,029,602 B2 | 4/2006 | Oshio | |
| 7,189,340 B2 | 3/2007 | Shimomura et al. | |

(Continued)

FOREIGN PATENT DOCUMENTS

JP        8 151573 A    6/1996

(Continued)

OTHER PUBLICATIONS

H. S. Jang, W. B. Im, D. C. Lee, D. Y. Jeon, S. S. Kim, Enhancement of red spectral emission intensity of Y3A15O12:Ce3+ phosphor via Pr co-doping and Tb substitution for the application to white LEDs, *J. Lumin.*, 126, 2007, 371-377.

(Continued)

*Primary Examiner* — Joseph L Williams
(74) *Attorney, Agent, or Firm* — Knobbe, Martens, Olson & Bear, LLP

(57) ABSTRACT

Disclosed herein are phosphor compositions which can exhibit a broad emission spectrum and improved color rendering index (CRI) relative to conventional phosphor materials. The phosphor compositions may, in some embodiments, be represented by the Formula I: $(RE_{2-x+y}Ce_xAk_{1-y})(MG_{4-z-r}Si_rMn_z)(Si_{1-e}P_e)O_{12-r}N_r$, wherein RE comprises at least one rare earth metal; Ak comprises at least one alkaline earth metal; MG comprises at least one main group element; x is greater than 0 and less than or equal to 0.2; y is less than 1; z is greater than 0 and less than or equal to 0.8; e is about 0 or less than or equal to 0.16; r is about 0 or less than or equal to 1; and z is about the sum of e and y. Also disclosed herein are lighting apparatuses including the phosphor compositions, as well as methods of making and using the phosphor compositions.

20 Claims, 11 Drawing Sheets

U.S. PATENT DOCUMENTS

| | | |
|---|---|---|
| 7,431,864 B2 | 10/2008 | Hirosaki |
| 7,514,721 B2 | 4/2009 | Krames et al. |
| 7,597,823 B2 | 10/2009 | Tamaki et al. |
| 2004/0164277 A1 | 8/2004 | Yen et al. |
| 2009/0096370 A1 | 4/2009 | Murazaki et al. |
| 2009/0108507 A1 | 4/2009 | Messing et al. |
| 2009/0212697 A1 | 8/2009 | Nakamura et al. |
| 2011/0227477 A1 | 9/2011 | Zhang et al. |

FOREIGN PATENT DOCUMENTS

| | | |
|---|---|---|
| JP | 11092133 A | 4/1999 |

OTHER PUBLICATIONS

N. E. Jouhari, C. Parent and G.Le. Flem, "Photoluminescence of Ce3+, Tb3+ and Mn2+ in glasses of base composition LaMgB5O12", *J. S. S. C.*, 123, 1996, 398-407.

Martinez-Martinez, R, et al. "White light generation through the zinc metaphosphate glass activated by Ce3+, Tb3+ and Mn2+ ions". *J. of Luminescence* 129:1276-1280 (1999).

Nag, et al., "Photoluminescence due to efficient energy transfer from Ce<3+> to Tb<3+> and Mn<2+> in Sr3Al10Si020," *Materials Chemistry and Physics, Elsevier SA*, Switzerland, Taiwan, Republic of China, vol. 91, No. 2-3, Jun. 15, 2005, pp. 524-531.

Okhubo et al. "Absolute Fluorescent Quantum Efficiency of NBS Phosphor Standard Sampls," 87-93, J. Mum. Eng. Inst. Jpn. vol. 83, No. 2, 1999.

N. Suriyamurthy, et al., "Luminescence of BaAl2O4:Mn2+,Ce3+ phosphor," *J. of Luminescence*, vol. 127, No. 2, Feb. 25, 2007, pp. 483-488.

P. Li, Z. Wang, Z. Yang, Q. Guo and X. Li, Luminescent characteristics of LiCaBO3:M, M = Eu3+, Sm3+, Tb3+, Ce3+ and Dy3+, phosphor for white LED, *J. Lumin.* 130, 2010, 222-225.

Wang X-J et al., "$Mn^{2+}$ activated green, yellow, and red long persistent phosphors," *J. of Luminescence*, Amsterdam, NL, vol. 102-103, May 1, 2003, pp. 34-37.

Yang, et al., "Influence of Doping and Coating on the Photolumnescence Properties of Yttrium Aluminum Garnet Phosphors," *Journal of Electrochemical Society*, vol. 154, No. 12, Jan. 1, 2007, p. J397.

International Search Report and Written Opinion received in Intl. Appln. No. PCT/US2011/042973, mailed Sep. 27, 2011.

PHOSPHOR COMPOSITION AND LIGHT EMITTING DEVICE USING THE SAME

CROSS-REFERENCE TO RELATED APPLICATIONS

This application claims the benefit of priority to U.S. Application No. 61/363,148, filed Jul. 9, 2010. The contents of this application are hereby incorporated by reference in their entirety.

BACKGROUND

1. Field

The present application relates to garnet oxide phosphor compositions co-doped with Ce and Mn, as well as methods of making the same. The present application also relates to lighting devices including said composition.

2. Description

Solid state light emitting devices, such as light emitting diode (LED), organic light emitting diode (OLED) or sometimes called organic electroluminescent device (OEL), and inorganic electroluminescent device (IEL), are widely utilized for various applications such as flat panel displays, indicators for various instruments, signboards, and ornamental illumination, etc. Improving the efficiency of these light emitting devices, especially LED, may provide higher luminescence intensities comparable to general purpose lighting devices, such as fluorescent and incandescent lamps. A white-LED, especially with a high color rendering index (CRI) and low correlated color temperature (CCT), shows promise as a replacement for existing general purpose lighting devices.

Conventionally, white-LED includes the combination of blue-LED and yellow light emitting YAG phosphor powder dispersed in an encapsulating resin, such as an epoxy or silicone (see e.g, U.S. Pat. Nos. 5,998,925 and 6,069,440). However, this YAG:Ce type LED system exhibits low CRI due to the lack of red luminescence. Accordingly, there is a need for phosphors providing broad spectral emission over a wider range of wavelengths, as well as simple processes for preparing these phosphors.

One approach for obtaining a broad emission spectrum has been to use Ce as an activator to provide a wide emission spectrum with peak positions from the green (about 480 nm to about 580 nm) to orange regions (about 585 nm to about 620 nm). Because the emission of Ce ions is associated with electron transitions from 5d orbitals, the emission spectra can be shifted by other cations present in the host lattice. It is reported that $Lu_2CaAl_4SiO_{12}$:Ce exhibits green emission when excited by blue LED (U.S. Pat. No. 7,029,602). Thus, $Lu_2CaAl_4SiO_{12}$:Ce exhibits a blue-shifted emission relative to $Y_3Al_5O_{12}$:Ce, which results from the smaller ionic size of Lu.

Mn ions usually exhibit emission in the green or red region depending upon the crystalline structure and lattice position. As such, Mn ions could theoretically improve the emission spectra of existing phosphors. Nevertheless, Mn ions poorly absorb blue light, and therefore only exhibit luminescence when excited by UV radiation. Consequently, Mn is not typically used in conventional white-LEDs having blue-LEDs to excite the luminescent phosphors.

SUMMARY

Some embodiments disclosed herein include a phosphor composition comprising a compound represented by the formula $(RE_{2-x+y}Ce_xAk_{1-y})(MG_{4-z-r}Si_rMn_z)(Si_{1-e}P_e)O_{12-r}N_r$, wherein: RE comprises at least one rare earth metal; Ak comprises at least one alkaline earth metal; MG comprises at least one main group element; x is greater than 0 and less than or equal to 0.2; y is less than 1; z is greater than 0 and less than or equal to 0.8; e is about 0 or less than or equal to 0.16; r is about 0 or less than or equal to 1; and z is about the sum of e and y.

In some embodiments, MG is selected from the group consisting of Al, Sc, In, Ga, B, Si and combinations thereof. In some embodiments, MG is Al.

In some embodiments, RE is selected from the group consisting of Lu, Y, Gd, Tb, Sm, Pr and combinations thereof. In some embodiments, RE is Lu.

In some embodiments, Ak is selected from the group consisting of Mg, Ca, Ba, Sr and combinations thereof. In some embodiments, Ak is Ca.

In some embodiments, r is about 0. In some embodiments, e is about 0.

In some embodiments, the compound is represented by the formula $(Lu_{2.16-x}Ce_x)Ca_{0.84}Al_{3.84}Mn_{0.16}SiO_{12}$, wherein x is greater than 0.0025 and less than 0.2. In some embodiments, x is about 0.16.

In some embodiments, the compound is represented by the formula $(Lu_{1.84+z}Ce_{0.16})Ca_{1-z}(Al_{4-z}Mn_z)SiO_{12}$, wherein z is greater than 0 and less than 0.8. In some embodiments, z is about 0.04. In some embodiments, z is about 0.02.

In some embodiments, e is greater than 0. In some embodiments, the compound is represented by the formula $(Lu_{1.84}Ce_{0.16})Ca(Al_{4-z}Mn_z)(Si_{1-z}P_z)O_{12}$, wherein z is at least about 0.01 and less than about 0.16. In some embodiments, z is about 0.02. In some embodiments, z is about 0.04.

In some embodiments, r is greater than 0.001. In some embodiments, e is about 0. In some embodiments, x is about 0.16. In some embodiments, r is about 0.4. In some embodiments, r is about 1. In some embodiments, z is about 0.16.

In some embodiments, the composition is represented by the formula selected from the group consisting of $(Lu_{1.86}Ce_{0.16}Ca_{0.98})(Al_{3.98}Mn_{0.02})SiO_{12}$, $(Lu_{1.88}Ce_{0.16}Ca_{0.96})(Al_{3.96}Mn_{0.04})SiO_{12}$, $(Lu_{1.84}Ce_{0.16})Ca(Al_{3.98}Mn_{0.02})(Si_{0.98}P_{0.02})O_{12}$ and $(Lu_{1.84}Ce_{0.16})Ca(Al_{3.96}Mn_{0.04})(Si_{0.96}P_{0.04})O_{12}$.

In some embodiments, the compound is represent by the formula $(Lu_{2-x+z}Ce_xCa_{1-z})(Al_{4-z-r}Si_rMn_z)SiO_{12-r}N_r$, wherein: x is greater than about 0.001 and less than about 0.4; z is greater than about 0.001 and less than about 0.4; and r is greater than about 0.2 and less than or equal to 1.

In some embodiments, the compound is represented by the formula selected from the group consisting of $(Lu_{2.0}Ce_{0.16}Ca_{0.84})(Al_{3.44}Si_{0.40}Mn_{0.16})SiO_{11.6}N_{0.40}$ and $(Lu_{2.0}Ce_{0.16}Ca_{0.84})(Al_{2.84}Si_{1.0}Mn_{0.16})SiO_{11}N_1$.

In some embodiments, the phosphor composition comprises a particulate that includes the compound.

In some embodiments, the phosphor composition is a sintered ceramic plate.

In some embodiments, the compound emits radiation at a peak wavelength between about 500 nm and about 650 nm when exposed to radiation having a wavelength of about 450 nm.

In some embodiments, the compound has a first wavelength of peak emission between about 515 nm and about 560 nm and a second wavelength of peak emission between about 600 and about 615 nm.

Some embodiments disclosed herein include a lighting apparatus comprising: a light source configured to emit blue radiation; and the phosphor composition, wherein the phosphor composition is configured to receive at a least a portion of the blue radiation. In some embodiments, the blue radiation has a wavelength of peak emission between about 430 nm to about 550 nm. In some embodiments, the blue radiation has a wavelength of peak emission of about 450 nm. In some embodiments, the lighting apparatus has a color rendering index (CRI) of at least 90.

Some embodiments disclosed herein include a method of producing light comprising exposing the phosphor composition to a blue radiation. In some embodiments, the blue radiation has a wavelength of peak emission between about 430 nm to about 550 nm. In some embodiments, the blue radiation has a wavelength of peak emission of about 450 nm. In some embodiments, the light has a color rendering index (CRI) of at least 90.

DETAILED DESCRIPTION

Figure 1:
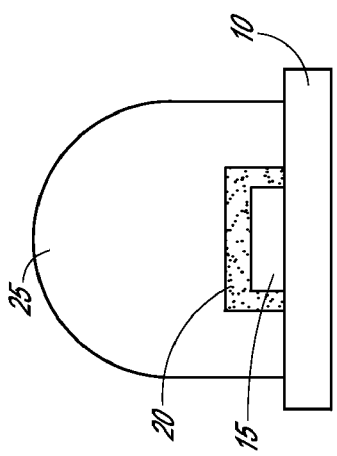
FIG. 1 shows an exemplary lighting apparatus including a powder form of a phosphor composition.

Disclosed herein are phosphor compositions exhibiting a broad emission spectrum and capable of being excited by blue light. Applicants have surprisingly found the addition of Manganese (Mn) to Cerium (Ce)-doped garnet phosphors, particularly $Lu_2CaAl_4SiO_{12}$, provides a broad emission spectrum when excited by blue radiation. In particular, the broad emission spectrum can exhibit two wavelengths of peak emission which may be attributable to Ce and Mn co-dopants. Without being bound to any particular theory, it is believed that Ce ions absorb blue radiation, and in turn, transfer energy to Mn ions which otherwise do not illuminate under blue radiation. Thus, the combination of Ce and Mn dopants synergistically provide a broad emission spectrum when receiving blue radiation from a standard blue LED. In contrast, phosphors doped only with Mn ions only illuminate under UV radiation, and phosphors doped only with Ce ions exhibit a narrower emission spectrum.

The phosphor compositions of the present application can provide superior lighting features over existing phosphors when implemented in standard LED lighting devices. As an example, the phosphor compositions may exhibit an improved CRI relative to existing phosphors. Accordingly, the phosphor compositions exhibit superior properties which may provide improved lighting devices suitable for general lighting purposes.

Phosphor Compositions

The phosphor compositions, in some embodiments, may be represented by the Formula I: $(RE_{2-x+y}Ce_xAk_{1-y})(MG_{4-z-r}Si_rMn_z)(Si_{1-e}P_e)O_{12-r}N_r$, wherein RE comprises at least one rare earth metal; Ak comprises at least one alkaline earth metal; MG comprises at least one main group element; x is greater than 0 and less than or equal to 0.2; y is less than 1; z is greater than 0 and less than or equal to 0.8; e is 0 or less than or equal to 0.16; r is 0 or less than or equal to 1; and z is about the sum of e and y.

In some embodiments, MG is selected from Al, Sc, In, Ga, B, Si and combinations thereof. In some embodiments MG is Al. In some embodiments, MG is Sc, In, Ga, B or Si. MG may also be a combination of at least two elements (e.g., two, three, four, five, or six) selected from Al, Sc, In, Ga, B, and Si. As an example, MG may be a combination of a first element and a second element, each selected from Al, Sc, In, Ga, B, and Si. The molar ratio of the first element to the second element can be, for example, at least about 10 to 90; at least about 20 to 80; at least about 40 to 60; or at least about 1 to 1. The molar ratio of first element to the second element can also be, for example, no more than about 90 to 10; no more than about 80 to 20; no more than about 60 to 40; or no more than about 1 to 1. In some embodiments, MG is a combination where the first element is Al. In some embodiments, MG is a combination where the second element is In. In some embodiments, MG is a combination where the second element is Ga. For example, MG may be a combination of Al and Ga with a molar ratio of about 1 to 1.

In some embodiments, RE is selected from Lu, Y, Gd, Tb, Sm, Pr and combinations thereof. In some embodiments, RE is Lu. RE may also be a combination of at least two elements (e.g., two, three, four, five, or six) selected from Lu, Y, Gd, Tb, Sm, and Pr. As an example, RE may be a combination of a first element and a second element, each selected from Lu, Y, Gd, Tb, Sm, and Pr. The molar ratio of the first element to the second element can be, for example, at least about 10 to 90; at least about 20 to 80; at least about 40 to 60; or at least about 1 to 1. The molar ratio of the first element to the second element can also be, for example, no more than about 90 to 10; no more than about 80 to 20; no more than about 60 to 40; or no more than about 1 to 1. In some embodiments, RE is a combination where the first element is Lu. In some embodiments, RE is a combination where the second element is Y. For example, RE may be a combination of Lu and Y with a molar ratio of about 1 to 1.

In some embodiments, Ak is selected from Mg, Ca, Ba, Sr and combinations thereof. In some embodiments, Ak is Ca. In some embodiments, Ak is Mg. Ak may also be a combination of at least two elements (e.g., two or three) selected from Ca, Ba, and Sr. As an example, Ak may be a combination of a first element and a second element each selected from Ca, Ba, and Sr. The molar ratio of the first element to the second element can be, for example, at least about 10 to 90; at least about 20 to 80; at least about 40 to 60; or at least about 1 to 1. The molar ratio of the first element to the second element can also be, for example, no more than about 90 to 10; no more than about 80 to 20; no more than about 60 to 40; or no more than about 1 to 1. In some embodiments, Ak is a combination where the first element is Ca. In some embodiments, Ak is a combination where the second element is Ba. For example, Ak may be a combination of Ca and Ba with a molar ratio of about 1 to 1.

In a preferred embodiment, MG is Al, RE is Lu and Ak is Ca. For example, some preferred phosphor compositions may be represented by Formula II: $(Lu_{2-x+y}Ce_xCa_{1-y})(Al_{4-z-r}Si_rMn_z)(Si_{1-e}P_e)O_{12-r}N_r$, where x is greater than 0 and less than or equal to 0.2; y is less than 1; z is greater than 0 and less than or equal to 0.8; e is 0 or less than or equal to 0.16; r is 0 or less than or equal to 1; and z is about the sum of e and y.

The relative amounts of the components recited in Formulae I and II is not particularly limited. A person of ordinary skill, guided by the teachings of the present application, may select appropriate amounts for each component in the phosphor composition based upon the intended lighting purpose. For example, as shown in Example 2, the relative amounts of co-dopants can be modified to adjust the relative size of the peaks in the emission spectrum, as well as the quantum efficiencies. Similarly, as another example, the composition of the host lattice will also modify the relative peaks of the emission spectrum.

Thus, increasing the amount of $Ce^{3+}$ obtains a red shift in the $Ce^{3+}$ emission wavelength. Meanwhile, increasing the amount of $Mn^{2+}$ obtains a blue shift in the $Ce^{3+}$ emission wavelength and a red shift in $Mn^{2+}$ emission wavelength. In the case of host modification, adding Gd or Tb increases the $Mn^{2+}$ emission.

Nevertheless, in some embodiments, the addition of Mn dopant into the phosphor composition of Formula I creates a charge imbalance which is preferably neutralized by adjusting the amounts of RE, Ak, and P relative to the amount of Ce and Mn.

The variable x can be, for example, at least about 0.001; at least about 0.01; or at least about 0.02. The variable x can also be, for example, no more than about 0.18 or no more than about 0.16. Exemplary values for x include, but are not limited to, about 0.08 and about 0.16.

The variable y, in some embodiments, is equal to about the difference between z and e (e.g., y=z−e). The variable y can be, for example, at least about 0.001; at least about 0.01; or at least about 0.02. The variable y can also be, for example, no more than about 0.8; no more than about 0.4; and no more than about 0.2. Exemplary values of y include, but are not limited to, 0, about 0.02, about 0.04, and about 0.16. In some embodiments, y is approximately the same as z.

The variable z can be, for example, at least about 0.001; at least about 0.01; or at least about 0.02. The variable z can also be, for example, no more than about 0.5; or no more than about 0.4. Exemplary values for z include, but are not limited to, about 0.02, about 0.04, and about 0.16. In some embodiments, z is about the sum of e and y. In some embodiments, z is approximately the same as e. In some embodiments, z is approximately the same as y.

The variable e, in some embodiments, is equal to the difference between z and y (e.g., e=z−y). The variable e can be, for example, at least about 0.001; at least about 0.01; or at least about 0.02. The variable e can also be, for example, no more than about 0.16; no more than about 0.12; or no more than about 0.08. Exemplary values for e include, but are not limited to, 0, about 0.02 and about 0.04. In some embodiments, e is approximately the same as z.

The variable r can be, for example, at least about 0.001; at least about 0.01; at least about 0.1; or at least about 0.2. The variable r can also be, for example, no more than about 1; or no more than about 0.6. Exemplary values of r include, but are not limited to, 0, about 0.4, and about 1.

In some embodiments, r is 0. For example, the phosphor compositions may be represented by Formula III: $(RE_{2-x-y}Ce_xAk_{1-y})(MG_{4-z}Mn_z)(Si_{1-e}P_e)O_{12}$, where RE, Ak, MG, x, y, z and e can be the same defined in Formula I. Non-limiting examples of phosphor compositions represented by Formula III include $(Lu_{1.86}Ce_{0.16}Ca_{0.98})(Al_{3.98}Mn_{0.02})SiO_{12}$, $(Lu_{1.88}Ce_{0.16}Ca_{0.96})(Al_{3.96}Mn_{0.04})SiO_{12}$, $(Lu_{0.84}Ce_{0.16})Ca(Al_{3.98}Mn_{0.02})(Si_{0.98}P_{0.02})O_{12}$ and $(Lu_{1.84}Ce_{0.16})Ca(Al_{3.96}Mn_{0.04})(Si_{0.96}P_{0.04})O_{12}$.

In some embodiments, e is 0. As an example, the phosphor compositions may be represented by Formula IV: $(RE_{2-x+z}Ce_xAk_{1-z})(MG_{4-z-r}Si_rMn_z)SiO_{12-r}N_r$, where RE, Ak, MG, x, y, z and r can be the same as in any of the embodiments of Formula I. Examples of phosphor compositions represented by Formula IV include, but are not limited to, $(Lu_{1.86}Ce_{0.16}Ca_{0.98})(Al_{3.98}Mn_{0.02})SiO_{12}$, $(Lu_{1.88}Ce_{0.16}Ca_{0.96})(Al_{3.96}Mn_{0.04})SiO_{12}$, $(Lu_{2.0}Ce_{0.16}Ca_{0.84})(Al_{3.44}Si_{0.40}Mn_{0.16})SiO_{11.6}N_{0.40}$ and $(Lu_{2.0}Ce_{0.16}Ca_{0.84})(Al_{2.84}Si_{1.0}Mn_{0.16})SiO_{11}N_1$.

In some embodiments, r is 0 and e is 0. The phosphor composition can, for example, be represented by Formula V: $(RE_{2-x+z}Ce_xAk_{1-z})(MG_{4-z}Mn_z)SiO_{12}$, where RE, Ak, MG, x and z are the same as defined in Formula I. In some embodiments, the phosphor composition is represented by Formula V, where z is about 0.16, and x is greater than about 0.025 and less than about 0.2, or preferably x is about 0.16. In some embodiments, x is about 0.16, and z is greater than 0 and less than about 0.8. In some embodiments, z is about 0.02 or z is about 0.04. Some exemplary phosphor compositions represented by Formula V include, but are not limited to, $(Lu_{1.86}Ce_{0.16}Ca_{0.98})(Al_{3.98}Mn_{0.02})SiO_{12}$ and $(Lu_{1.88}Ce_{0.16}Ca_{0.96})(Al_{3.96}Mn_{0.04})SiO_{12}$.

In some embodiments, e is greater than 0, and r is 0. For example, the phosphor compositions may be represented the compound of Formula VI: $(RE_{2-x+y}Ce_xAk_{1-y})(MG_{4-z}Mn_z)(Si_{1-e}P_e)O_{12}$, where RE, Ak, MG, x, y, z and e are the same as defined in Formula I. In some embodiments, the phosphor compositions are represented by Formula VI, and y is about 0. As an example, the phosphor compositions are represent by Formula VII: $(RE_{2-x}Ce_xAk)(MG_{4-z}Mn_z)(Si_{1-z}P_z)O_{12}$, where RE, Ak, MG, x and z are the same as defined in Formula I. In some embodiments, x may be about 0.08 or about 0.16. In some embodiments, z is greater than about 0.01 and less than about 0.16, about 0.02 or about 0.04. Exemplary phosphor compositions represented by Formulas VI and VII include, but are not limited to, $(Lu_{1.92}Ce_{0.08})Ca(Al_{3.98}Mn_{0.02})(Si_{0.98}P_{0.02})O_{12}$, $(Lu_{1.92}Ce_{0.08})Ca(Al_{3.96}Mn_{0.04})(Si_{0.96}P_{0.04})O_{12}$, $(Lu_{1.84}Ce_{0.16})Ca(Al_{3.98}Mn_{0.02})(Si_{0.98}P_{0.02})O_{12}$ and $(Lu_{1.84}Ce_{0.16})Ca(Al_{3.96}Mn_{0.04})(Si_{0.96}P_{0.04})O_{12}$.

In some embodiments, r is greater than about 0.001. In some embodiments, r is greater than about 0.001 and e is 0. For example, the phosphor compositions may be represented by Formula VIII: $(RE_{2-x-z}Ce_xAk_{1-z})(MG_{4-z-r}Si_rMn_z)SiO_{12-r}N_r$, where RE, Ak, MG, x, z and r can be the same as in any of the embodiments of Formula I. In some embodiments, the phosphor compositions are represented by Formula VIII, where r is about 0.4. In some embodiments, the phosphor compositions are represented by Formula VIII, where r is about 1.0. In some embodiments, the phosphor compositions are represented by Formula VIII, where x is about 0.16. In some embodiments, the phosphor compositions are represented by Formula VIII, where z is greater than about 0.001 and less than about 0.4 (preferably z is about 0.16). Non-limiting examples of phosphor compositions represented by Formula VIII include $(Lu_{2.0}Ce_{0.16}Ca_{0.84})(Al_{3.44}Si_{0.40}Mn_{0.16})SiO_{11.6}N_{0.40}$ and $(Lu_{2.0}Ce_{0.16}Ca_{0.84})(Al_{2.84}Si_{1.0}Mn_{0.16})SiO_{11.6}N_1$.

The phosphor compositions of the present application may advantageously exhibit a broad emission spectrum when excited by blue radiation. The phosphor composition may, in some embodiments, emit radiation at a peak wavelength between about 500 nm and about 650 nm when exposed to radiation having a wavelength of about 450 nm. The phosphor composition may, in some embodiments, have a first wavelength of peak emission between about 515 nm and about 560 nm and a second wavelength of peak emission between about 600 and about 615 nm. In some embodiments, the composition exhibits a third wavelength of peak emission between about 730 nm and about 770 nm.

The phosphor composition may also exhibit a high color rendering index (CRI) and/or low correlated color temperature (CCT). The phosphor composition can exhibit a CRI of at least about 70 when exposed to blue radiation. The blue radiation may have a peak wavelength, for example, in the range of 350 nm to 550 nm, or about 450 nm. In some embodiments, the CRI is at least about 80; at least about 85; at least about 90; or about 91. Meanwhile, the reference CCT may be in the range of 2500 K to about 10000 K; in the range of about 2500 K to about 5000 K; in the range of about 2500 K to about 4500 K; or in the range of about 2600 to about 3400 K.

In some embodiments, the phosphor composition can be in particulate form (e.g., a powder). The particulate may, for example, have an average particle size of less than about 1 mm; less than about 500 μm; less than about 100 μm; or less than about 1 μm. The particulate may also, for example, have an average particle size of no more than about 1 nm; no more than about 50 nm; no more than about 100 nm; no more than about 500 nm; or no more than about 1 μm. In some embodiments, the particulate has an average particle size in the range of about 1 nm to about 1 mm. As discussed further below regarding the lighting apparatuses, the phosphor powder may be encapsulated (or dispersed) within a resin, such as an epoxy.

The phosphor composition may include varying amounts of the one or more compounds represented by any one of Formulae I-VIII. In some embodiments, the phosphor composition includes at least about 1% by weight of one or more compounds represented by any one of Formulae I-VIII. In some embodiments, the phosphor composition includes at least about 10% by weight of one or more compounds represented by any one of Formulae I-VIII. In some embodiments, the phosphor composition includes at least about 25% by weight of one or more compounds represented by any one of Formulae I-VIII. In some embodiments, the phosphor composition includes at least about 50% by weight of one or more compounds represented by any one of Formulae I-VIII. In some embodiments, the phosphor composition includes at least about 75% by weight of one or more compounds represented by any one of Formulae I-VIII.

The total light transmittance of each of the phosphor composition at about the peak wavelength of emission, or about the peak wavelength of the photoluminescent spectrum of the phosphor composition, may, in some embodiments, be at least about 25% of the theoretical total light transmittance; at least about 40% of the theoretical total light transmittance; or at least about 60% of the theoretical total light transmittance.

Methods of Making Phosphor Compositions

The phosphor compositions of the present application, such as those represented by any one of Formulae I-VIII, may be prepared using conventional techniques known by a person skilled in the art. As an example, the phosphor compositions may be produced using known solid state reaction processes for the production of phosphors by combining, for example, elemental oxides, carbonates and/or hydroxides as starting materials. Other starting materials may include nitrates, sulfates, acetates, citrates, or oxalates. Alternately, coprecipitates of the rare earth oxides can be used as the starting materials for the RE elements. Si may be provided via $SiO_2$, silicic acid, or other sources such as fumed silica.

In one example process of making the above phosphors, an array slurry method can be used. Raw materials (e.g., $Lu_2O_3$, $Y_2O_3$, $Gd_2O_3$, $Tb_4O_7$, $Sm_2O_3$, $Pr_6O_{11}$, $CaCO_3$, $BaCO_3$, $SrCO_3$, $MnCO_3$, $Si_3N_4$, $CeO_2$, $MgO$, $SiO_2$, and $Al_2O_3$) are milled down to micron size powders and then dispersed in water up to about 16% by weight solid loading. The slurries may be dispensed into alumina crucibles via a commercial liquid handler under vigorous mixing. The homogenous solid mixture results after water evaporation and firing the slurries at about 1200° C. to about 1700° C. under a reducing atmosphere (e.g., approximately 1% $H_2$ in air).

In another example process, the starting materials are combined via a dry or wet blending process and fired in air or under a reducing atmosphere at about 1000° C. to about 1600° C. A fluxing agent (e.g., sintering aids) may be added to the mixture before or during the step of mixing. In some embodiments, the sintering aids may include, but are not limited to, tetraethyl orthosilicate (TEOS), colloidal silica, lithium oxide, titanium oxide, zirconium oxide, magnesium oxide, barium oxide, calcium oxide, strontium oxide, boron oxide, or calcium fluoride. Additional sintering aids include, but are not limited to, metal halides (e.g., NaCl, KCl, $AlF_3$, or $NH_4Cl$) and organic compounds such as urea. In some embodiments, the phosphor composition comprises between about 0.01% and about 5%, between about 0.05% and about 5%, between about 0.1% and about 4%, or between about 0.3% and about 1% by weight of the flux material(s) or sintering aid(s). The sintering aid can be intermixed with the raw materials. For example, in some embodiments, tetraethyl orthosilicate (TEOS) can be added to the raw materials to provide the desired amount of sintering aid. In some embodiments, about 0.05% to about 5% by weight of TEOS is provided to phosphor composition. In some embodiments, the amount of TEOS may be between about 0.3% and about 1% by weight.

The starting materials may be mixed together by any mechanical method including, but not limited to, stirring or blending in a high-speed blender or a ribbon blender. The starting materials may be combined and subjected to comminution in a bowl mill, a hammer mill, or a jet mill. The mixing may be carried out by wet milling, preferably when the mixture of the starting materials is to be made into a solution for subsequent precipitation. If the mixture is wet, it may be dried first before being fired under a reducing atmosphere at a temperature from about 900° C. to about 1700° C. (preferably from about 1000° C. to about 1600° C.) for a time sufficient to convert substantially all of the mixture to the final composition.

The firing may be conducted in a batch-wise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen or helium, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

In some embodiments, the starting materials may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate from the acidic solution may then be filtered, washed with deionized water, and dried. The dried precipitate can be subject to comminution (e.g., ball milled or otherwise thoroughly blended) and then calcined in air at about 400° C. to about 1600° C. for a sufficient time to ensure a substantially complete dehydration of the starting materials. The calcination may be carried out at a constant temperature. Alternatively, the calcination temperature may be ramped from ambient temperatures and held at the final temperature for the duration of the calcination. The calcined material is similarly fired at about 1000° C. to about 1600° C. for a sufficient time under a reducing atmosphere such as $H_2$, CO, or a mixture of one of these gases with an inert gas. Alternatively, the reducing atmosphere may be generated by a reaction between a coconut charcoal and the products of the decomposition of the starting materials to covert all of the calcined material to the desired phosphor composition.

While the phosphor compositions can be suitable in many applications alone, the above phosphor composition may be intermixed with one or more additional phosphors for use in LED light sources.

Laminating and Sintering to Form a Ceramic Plate

The phosphor composition may be formed by laminating and sintering two or more cast tapes to form a ceramic plate, where the cast tapes can include any of the compounds represented by Formulae I-VIII, or precursors thereof. Examples and methods of laminating and sintering two or more cast tapes are disclosed in U.S. Pat. No. 7,514,721 and U.S. Publication No. 2009/0108507, both of which are hereby incorporated by reference in their entirety.

First, the particle size of the raw materials (e.g., nitrate or oxide based raw materials, such as $Y_2O_3$ and $Al_2O_3$ for forming YAG) may optionally be adjusted to reduce cracking in the cast tapes from capillary forces during evaporation of solvents. For example, the particle size can be adjusted by pre-annealing raw material particles to obtain the desired particle size. Raw material particles can be pre-annealed in the temperature range of about 800° C. to about 1800° C. (or more preferably 1000° C. to about 1500° C.) to obtain the desired particle size. The pre-annealing may occur in a vacuum, air, $O_2$, $H_2$, $H_2/N_2$, or a noble gas (e.g., He, Ar, Kr, Xe, Rn, or combinations thereof). In an embodiment, each of the raw materials is adjusted to be about the same particle size. In another embodiment, the particles have a BET surface area in the range of about 0.5 $m^2/g$ to about 20 $m^2/g$ (preferably about 1.0 $m^2/g$ to about 10 $m^2/g$, or more preferably about 3.0 $m^2/g$ to about 6.0 $m^2/g$).

A slurry may then be prepared for subsequently casting into a tape. Pre-made phosphors (e.g., phosphors prepared by flow-based thermochemical synthetic routes described herein) and/or stoichiometric amounts of raw materials can be intermixed with various components to form a mixture. Examples of components for the mixture include, but are not limited to, dopants, dispersants, plasticizers, binders, sintering aids and solvents. The dopants, sintering aids, plasticizers, binders and solvents may be the same as those described above with respect to the molding and sintering process.

In some embodiments, the dispersants can be Flowen, fish oil, long chain polymers, stearic acid, oxidized Menhaden fish oil, dicarboxylic acids such succinic acid, orbitan monooleate, ethanedioic acid, propanedioic acid, pentanedioic acid, hexanedioic acid, heptanedioic acid, octanedioic acid, nonanedioic acid, decanedioic acid, o-phthalic acid, p-phthalic acid and mixtures thereof.

The mixture may then be subjected to comminution to form a slurry by, for example, ball milling the mixture for a time period in the range of about 0.5 hrs. to about 100 hrs. (preferably about 6 hrs. to about 48 hrs., or more preferably about 12 hrs. to about 24 hrs.). The ball milling may utilize milling balls that include materials other than the components intermixed within the mixture (e.g., the milling balls may be $ZrO_2$). In an embodiment, the ball milling includes isolating the milling balls after a period of time by filtration or other known methods of isolation. In some embodiments, the slurry has a viscosity in the range of about 10 cP to about 5000 cP (preferably about 100 cP to about 3000 cP, or more preferably about 400 cP to 1000 cP).

Third, the slurry may be cast on a releasing substrate (e.g., a silicone coated polyethylene terephthalate substrate) to form a tape. For example, the slurry may be cast onto a moving carrier using a doctor blade and dried to form a tape. The thickness of the cast tape can be adjusted by changing the gap between the doctor blade and the moving carrier. In some embodiments, the gap between the doctor blade and the moving carrier is in the range of about 0.125 mm to about 1.25 mm (preferably about 0.25 mm to about 1.00 mm, or more preferably about 0.375 mm to about 0.75 mm). Meanwhile, the speed of the moving carrier can have a rate in the range of about 10 cm/min. to about 150 cm/min. (preferably about 30 cm/min. to about 100 cm/min., or more preferably about 40 cm/min. to about 60 cm/min.). By adjusting the moving carrier speed and the gap between the doctor blade and moving carrier, the tape can have a thickness between about 20 μm and about 300 μm. The tapes may optionally be cut into desired shapes after casting.

Two or more tapes are laminated to form an assembly. The lamination step can include stacking two or more tapes (e.g., 2 to 100 tapes are stacked) and subjecting the stacked tapes to heat and uniaxial pressure (e.g., pressure perpendicular to the tape surface). For example, the stacked tapes may be heated above the glass transition temperature ($T_g$) of the binder contained in the tape and compressed uniaxially using metal dies. In some embodiments, the uniaxial pressure is in the range of about 1 to about 500 MPa (preferably about 30 MPa to about 60 MPa). In some embodiments, the heat and pressure is applied for a time period in the range of about 1 min. to about 60 min. (preferably about 15 min. to about 45 min., or more preferably about 30 min.). The lamination step may optionally include forming various shapes (e.g., holes or pillars) or patterns into the assembly by, for example, using shaped dies.

Some embodiments of the assembly include at least one tape having a phosphor composition represented by any one of Formulae I-VIII. In some embodiments, all of the stacked tapes include a phosphor composition represented by any one of Formulae I-VIII.

The assembly may be heated to form the composite. The heating step may include a debinding process and a sintering process. The debinding process includes decomposing at least a portion of organic components within the assembly (e.g., volatilize binders and plasticizers within the assembly). As an example, the assembly may be heated in air to a temperature in the range of about 300° C. to about 1200° C. (preferably about 500° C. to about 1000° C., or more preferably about 800° C.) at a rate of about 0.1° C./min. to about 10° C./min. (preferably about 0.3° C./min. to about 5° C./min., or more preferably about 0.5° C./min. to about 1.5° C./min). The example of a heating step may also include maintaining the temperature for a time period in the range of about 30 min. to about 300 min., which may be selected based upon the thickness of the assembly.

The heating step also includes a sintering process to form the composite. The assembly may be sintered in a vacuum, air, $O_2$, $H_2$, $H_2/N_2$, or a noble gas (e.g., He, Ar, Kr, Xe, Rn, or combinations thereof) at a temperature in the range of about 1200° C. to about 1900° C. (preferably about 1300° C. to about 1800° C., or more preferably about 1350° C. to about 1700° C.) for a time period in the range of about 1 hr. to about 100 hrs (preferably about 2 hrs. to about 10 hrs.). In some embodiments, the debinding and sintering processes are completed in a single step.

The assembly may be sandwiched between cover plates during the heating step to reduce distortion (e.g., warping, cambering, bending, etc.) of the assembly. The cover plates may include materials having a melting point above the temperatures applied during the heating step. Moreover, the cover plate may be sufficiently porous to permit transport of volatilized components through the covering plates. As an example, the covering plate may be zirconium dioxide having a porosity of about 40%.

Molding and Sintering to Form a Ceramic Plate

The phosphor composition may be prepared by molding and sintering one or more phosphors to form a ceramic plate. In some embodiments, the phosphor composition comprises a composition represented by any one of Formulae I-VIII. Examples of ceramic plates and methods of making the same are disclosed U.S. Publication No. 2009/0212697 and U.S. Application No. 61/315,763, both of which are hereby incorporated by reference in their entirety.

First, raw phosphor powders are provided, such as the phosphor powders described herein. The raw powders may be prepared using any conventional or suitable methods, such as the flow-based thermochemical synthetic routes described herein. In some embodiments, raw powders of phosphor materials used to make the composite are typically nano-sized particles with average particle size no greater than about 1000 nm, preferably no greater than about 500 nm, more preferably no greater than 200 nm. If the particle size is greater than about 1000 nm, it can be very difficult to make total light transmittance higher than about 50%, because such large particles do not easily fuse with each other even at a high temperature and high pressure sintering condition. The result would be a tendency for a lot of air voids to remain in the ceramic plate. On the other hand, nano-sized particles can easily fuse with each other, which enable us to prepare fine and air void free ceramic plates. The raw materials are not required to have the same composition or crystal structure of resultant phosphor ceramic plate.

In some embodiments, small quantities of flux materials (e.g., sintering aids) may be used in order to improve sintering properties if desired. In some embodiments, the sintering aids may include, but not limited to, tetraethyl orthosilicate (TEOS), colloidal silica, lithium oxide, titanium oxide, zirconium oxide, magnesium oxide, barium oxide, calcium oxide, strontium oxide, boron oxide, or calcium fluoride. Additional sintering aids include, but are not limited to, alkali metal halides such as NaCl or KCl, and organic compounds such as urea.

Various plasticizers may also be included, in some embodiments, to reduce the glass transition temperature and/or improve flexibility of the ceramic. Non-limiting examples of plasticizers include dicarboxylic/tricarboxylic ester-based plasticizers, such as bis(2-ethylhexyl) phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, and di-n-hexyl phthalate; adipate-based plasticizers, such as bis(2-ethylhexyl)adipate, dimethyl adipate, monomethyl adipate, and dioctyl adipate; sebacate-based plasticizers, such as dibutyl sebacate, and maleate; dibutyl maleate; diisobutyl maleate; polyalkylene glycols such as polyethylene glycol, polypropylene glycol, and copolymers thereof; benzoates; epoxidized vegetable oils; sulfonamides, such as N-ethyl toluene sulfonamide, N-(2-hydroxypropyl)benzene sulfonamide, and N-(n-butyl) benzene sulfonamide; organophosphates, such as tricresyl phosphate, tributyl phosphate; glycols/polyethers, such as triethylene glycol dihexanoate, tetraethylene glycol diheptanoate; alkyl citrates, such as triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, and trimethyl citrate; alkyl sulphonic acid phenyl ester; and mixtures thereof.

Next, the raw materials may be mixed together and formed into a mold. In some embodiments, the mixing and molding process may be made easier by occasionally adding binder resin and solvent to the raw powders. A binder is any substance that improves adhesion of the particles of the composition being heated to form a composite. Some non-limiting examples of binders include polyvinyl alcohol, polyvinyl acetate, polyvinyl chloride, polyvinyl butyral, polystyrene, polyethylene glycol, polyvinylpyrrolidones, polyvinyl acetates, and polyvinyl butyrates, etc. In some, but not all, circumstances, it may be useful for the binder to be sufficiently volatile that it can be completely removed or eliminated from the precursor mixture during the sintering phase. Solvents which may be used in include, but not limited to water, a lower alkanol such as but not limited to denatured ethanol, methanol, isopropyl alcohol and mixtures thereof, preferably denatured ethanol, xylenes, cyclohexanone, acetone, toluene and methyl ethyl ketone, and mixtures thereof. In a preferred embodiment, the solvent is a mixture of xylenes and ethanol.

The mixing process can be done using a mortar and pestle, ball milling machine, bead milling machine or other equivalent equipments. For the molding process, a simple die for tablet molding, hot isostatic pressing (HIP), or cold isostatic pressing (CIP) may be utilized. In some embodiments, controlled quantities of raw powders are loaded in a mold followed by applying pressure to form the plate. The mold is then sintered at a high temperature that does not exceed the melting point of the resultant phosphor materials.

Any kinds of suitable ceramic sintering techniques can be used to prepare translucent ceramic plates. In some embodiments, sintering may be carried out while applying pressure. Sintering conditions such as the temperature profile, atmosphere, pressure, and duration will depend on the type of phosphor material.

Lighting Apparatuses

The phosphor compositions disclosed herein may be included within a lighting apparatus. Various configurations for the lighting apparatus are within the scope of the present application. FIGS. 1-2 (not drawn to scale) provide non-limiting examples of lighting apparatuses within the scope of the present application. FIG. 1 is an exemplary lighting apparatus having a phosphor powder composition. A submount 10 has a light source 15, such as a conventional base LED mounted thereon. The light source 15 is adjacent to encapsulated phosphor powder 20 which receives at least a portion of the light emitted from the light source 15. An optional encapsulant resin 25 is placed over the light source 15 and the encapsulated phosphor powder 20. The encapsulated phosphor powder 20 can include any of the co-doped phosphor compositions disclosed in the present application. For example, the encapsulated phosphor powder 20 can include the phosphor composition of Formula I.

The phosphor compositions may be encapsulated in a mold (e.g., as illustrated in FIG. 1 by encapsulant resin 25). For example, the composition may be formed into a mold by encapsulating the phosphor composition in a resin, such as an epoxy or silicone. Examples and methods for encapsulating the phosphors are disclosed in U.S. Pat. Nos. 5,998,925 and 6,069,440, both of which are hereby incorporated by reference in their entirety. Briefly, a powder form of the phosphor composition may be intermixed with a resin to form a slurry. The slurry may then be cured to form the mold.

In some embodiments, the phosphor composition is intermixed with an optional second phosphor and disposed within the lighting apparatus. For example, a mixture of the phosphor composition of Formula I and a second phosphor (e.g., YAG:Ce) may be prepared and subsequently encapsulated within a resin.

Figure 2B:
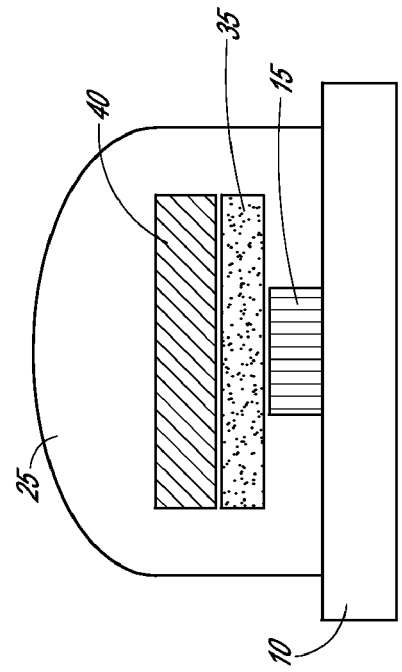
FIGS. 2A-B shows exemplary lighting apparatuses including emissive layers having a phosphor composition.
Figure 2A:
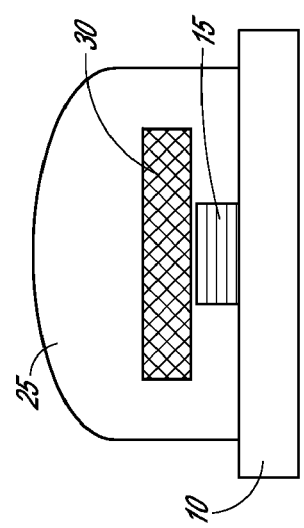

FIG. 2A is another example of a lighting apparatus where the phosphor composition is contained within an emissive layer 30 (e.g., the emissive layer is a sintered ceramic plate as discussed above) which receives at least a portion of the light emitted from the light source 15. Emissive layer 30 can, for example, be a ceramic plate including the phosphor composition. In some embodiments, the emissive layer 30 includes the phosphor composition and an optional second phosphor. For example, the emissive layer 30 may include the phosphor composition of Formula I and a second phosphor (e.g., YAG:Ce).

FIG. 2B is still another example of a lighting apparatus where the phosphor composition and an optional second phosphor are contained within separates emissive layers. The first emissive layer 40 is disposed above light source 15 and receives at least a portion of the light emitted from the light source 15. First emissive layer 40 can, for example, be a ceramic plate including the phosphor composition and/or the optional second phosphor. The second emissive layer 35 is disposed between the first emissive layer 40 and the light source 15. The second emissive layer 35 also receives at least a portion of the light emitted from the light source 15. Second emissive layer 35 can, for example, be a ceramic plate including the phosphor composition and/or the optional second phosphor. In some embodiments, the first emissive layer 40 comprises the phosphor composition and the second emissive layer 35 comprises the optional second phosphor. In some embodiments, the first emissive layer 40 comprises the optional second phosphor and the second emissive layer 35 comprises the phosphor composition.

The location of the various components in FIGS. 1-2 (e.g., the light source, the phosphor composition, etc.) are for illustrative purposes and not intended to be limiting. In some embodiments, the components are configured so that the phosphor composition receives at a least a portion of the radiation emitted from the light source. In some embodiments, the components are configured so that the optional second phosphor receives at a least a portion of the radiation emitted from the light source.

The light source (e.g., as illustrated in FIGS. 1-2 by light source 15) may, in some embodiments, be configured to emit blue radiation. For example, the blue radiation may include a wavelength of peak emission between about 430 nm and about 550 nm. In some embodiment, the light source emits blue radiation having a wavelength of peak emission of about 450 nm. Some embodiments include a light source that is a semiconductor LED. As an example, the light source may be an AlInGaN based single crystal semiconductor material coupled to an electric source.

The lighting apparatuses of the present application may advantageously produce a broad emission spectrum. The lighting apparatuses may, in some embodiments, emit radiation including a peak wavelength between about 500 nm and about 650 nm. The phosphor lighting apparatus may, in some embodiments, emit radiation including a first wavelength of peak emission between about 515 nm and about 560 nm and a second wavelength of peak emission between about 600 and about 615 nm. In some embodiments, the lighting apparatuses emit radiation including a third wavelength of peak emission between about 730 nm and about 770 nm.

The lighting apparatuses may also exhibit a high CRI and/or low CCT. For example, the lighting apparatus can emit light with a CRI of at least about 70. In some embodiments, the CRI is at least about 80; at least about 90; or about 91. The reference CCT may be in the range of about 2500 K to about 10000 K; in the range of about 2500 K to about 5000 K; in the range of about 2500 K to about 4500 K; or in the range of about 2600 to about 3400 K.

Methods of Using the Phosphor Composition

Also disclosed herein are methods of producing light including exposing the phosphor composition to blue radiation. For example, the phosphor composition may be represented by any one of Formulae I-VIII. In some embodiments, the blue radiation has a wavelength of peak emission between about 430 nm to about 550 nm. In some embodiments, the blue radiation has a wavelength of peak emission of about 450 nm.

The methods of the present application may advantageously produce a broad emission spectrum. The method may, in some embodiments, produce radiation including a peak wavelength between about 500 nm and about 650 nm. The method may, in some embodiments, produce radiation including a first wavelength of peak emission between about 515 nm and about 560 nm and a second wavelength of peak emission between about 600 and about 615 nm. In some embodiments, the methods produce radiation having a third wavelength of peak emission between about 730 nm and about 770 nm.

The method may also produce light with a high CRI and/or low CCT. For example, the method can produce light with a CRI of at least about 70. In some embodiments, the CRI is at least about 80; at least about 90; or about 91. The reference CCT may be in the range of about 2500 K to about 10000 K; in the range of about 2500 K to about 5000 K; in the range of about 2500 K to about 4500 K; or in the range of about 2600 to about 3400 K.

EXAMPLES

Additional embodiments are disclosed in further detail in the following examples, which are not in any way intended to limit the scope of the claims.

Example 1

Preparing Phosphor Compositions $Lu_{2.0}Ce_{0.16}Ca_{0.84}Al_{3.84}Mn_{0.16}SiO_{12}$ was prepared by hand mixing the following ingredients into a methanol slurry until the slurry dried: 5 g of $Lu_2O_3$, 0.345 g of $CeO_2$, 1.055 g of $CaCO_3$, 2.46 g of $Al_2O_3$, 0.23 g of $MnCO_3$ and 0.755 g of $SiO_2$. This mixture was then transferred into an alumina boat and heated to 600° C. in air at a ramp rate of 4° C./min. Subsequently, $H_2/N_2$ gas was passed over the heated mixture and the temperature increased to 1500° C. at a heating rate of 4° C./min. The temperate was maintained at 1500° C. for 5 hours and then cooled to room temperature while still exposed $H_2/N_2$. The lump was crushed by hand into powder to yield $Lu_{2.0}Ce_{0.16}Ca_{0.84}Al_{3.84}Mn_{0.16}SiO_{12}$ (Composition 1) for further investigation.

Various examples of compositions represented by Formula I are disclosed in TABLE 1, where compositions having more than one element in a column denote a combination of each element at a 1 to 1 molar ratio. For example, Composition 16 has about equal molar parts of Ca and Sr as the main group element (MG). Compositions 2-27 were prepared using similar methods as described above. Compositions 28-30 may also be prepared using similar methods as described above.

TABLE 1

| Composition | RE | Ak | MG | x | y | z | e | r |
|---|---|---|---|---|---|---|---|---|
| 1 | Lu | Ca | Al | 0.16 | 0.16 | 0.16 | 0 | 0 |
| 2 | Lu | Ca | Al | 0.20 | 0.16 | 0.16 | 0 | 0 |
| 3 | Lu | Ca | Al | 0.12 | 0.16 | 0.16 | 0 | 0 |
| 4 | Lu | Ca | Al | 0.08 | 0.16 | 0.16 | 0 | 0 |
| 5 | Lu | Ca | Al | 0.06 | 0.16 | 0.16 | 0 | 0 |
| 6 | Lu | Ca | Al | 0.04 | 0.16 | 0.16 | 0 | 0 |
| 7 | Lu | Ca | Al | 0.02 | 0.16 | 0.16 | 0 | 0 |
| 8 | Lu | Ca | Al | 0.01 | 0.16 | 0.16 | 0 | 0 |
| 9 | Lu | Ca | Al | 0.005 | 0.16 | 0.16 | 0 | 0 |
| 10 | Lu | Ca | Al | 0.16 | 0.40 | 0.40 | 0 | 0 |
| 11 | Lu | Ca | Al | 0.16 | 0.28 | 0.28 | 0 | 0 |
| 12 | Lu | Ca | Al | 0.16 | 0.12 | 0.12 | 0 | 0 |
| 14 | Lu | Ca | Al | 0.16 | 0.08 | 0.08 | 0 | 0 |
| 15 | Lu | Ca | Al | 0.16 | 0.04 | 0.04 | 0 | 0 |
| 16 | Lu | Ca, Sr | Al | 0.16 | 0.16 | 0.16 | 0 | 0 |
| 17 | Lu | Ca, Ba | Al | 0.16 | 0.16 | 0.16 | 0 | 0 |
| 18 | Lu, Y | Ca | Al | 0.16 | 0.16 | 0.16 | 0 | 0 |
| 19 | Lu, Tb | Ca | Al | 0.16 | 0.16 | 0.16 | 0 | 0 |
| 20 | Lu, Gd | Ca | Al | 0.16 | 0.16 | 0.16 | 0 | 0 |
| 21 | Lu | Ca | Al, In | 0.16 | 0.16 | 0.16 | 0 | 0 |
| 22 | Lu | Ca | Al, Ga | 0.16 | 0.16 | 0.16 | 0 | 0 |
| 23 | Lu | Ca | Al | 0.16 | 0 | 0.02 | 0 | 0 |
| 24 | Lu | Ca | Al | 0.16 | 0 | 0.16 | 0.16 | 0 |
| 25 | Lu | Ca | Al | 0.16 | 0.16 | 0.16 | 0 | 0.5 |
| 26 | Lu | Ca | Al | 0.16 | 0.16 | 0.16 | 0 | 1.0 |
| 27 | Lu | Ca, Mg | Al | 0.16 | 0.16 | 0.16 | 0 | 1.0 |
| 28 | Lu | Ca | Al | 0.16 | 0 | 0.02 | 0.02 | 0 |
| 29 | Lu | Ca | Al | 0.16 | 0 | 0.04 | 0.04 | 0 |
| 30 | Lu | Ca | Al | 0.16 | 0 | 0.08 | 0.08 | 0 |

Example 2

Evaluating Luminescence of Phosphor Powders

The luminescence efficiency of phosphor powder was evaluated by measuring the emission from the phosphor powders irradiated by standard excitation light with a predetermined intensity. The internal quantum efficiency (IQE) of a phosphor is the ratio of the number of photons generated from the phosphor to the number of photons of excitation light which penetrate into the phosphor.

The IQE of a phosphor material can be expressed by the following formula:

$$InternalQuantumEfficiency = \frac{\int \lambda \cdot P(\lambda) d\lambda}{\int \lambda \cdot E(\lambda) \cdot [1 - R(\lambda)] d\lambda}$$

$$ExternalQuantumEfficiency(\lambda) = InternalQuantumEfficiency(\lambda) \cdot [1 - R(\lambda)]$$

$$Absorption(\lambda) = 1 - R(\lambda)$$

where at any wavelength of interest $\lambda$, $E(\lambda)$ is the number of photons in the excitation spectrum that are incident on the phosphor, $R(\lambda)$ is the number of photons in the spectrum of the reflected excitation light, and $P(\lambda)$ is the number of photons in the emission spectrum of the phosphor. This method of IQE measurement is also provided in Ohkubo et al., "Absolute Fluorescent Quantum Efficiency of NBS Phosphor Standard Samples," 87-93, J. Illum. Eng. Inst. Jpn. Vol. 83, No. 2, 1999, the disclosure of which is incorporated herein by reference in its entirety.

Example 2.1

Figure 3:
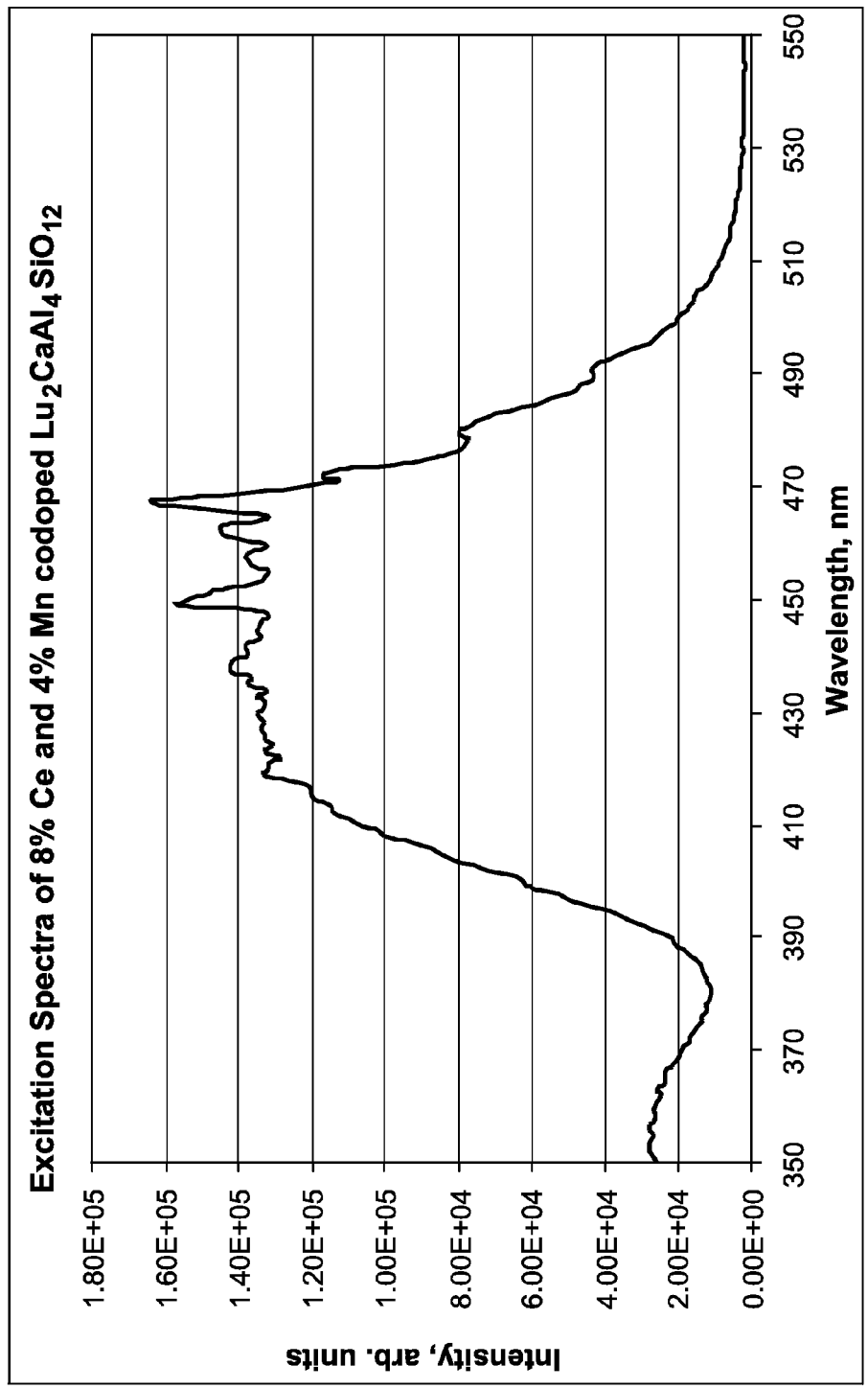
FIG. 3 shows the excitation spectrum for $Lu_{2.0}Ce_{0.16}Ca_{0.84}Al_{3.84}Mn_{0.16}SiO_{12}$.
Figure 4:
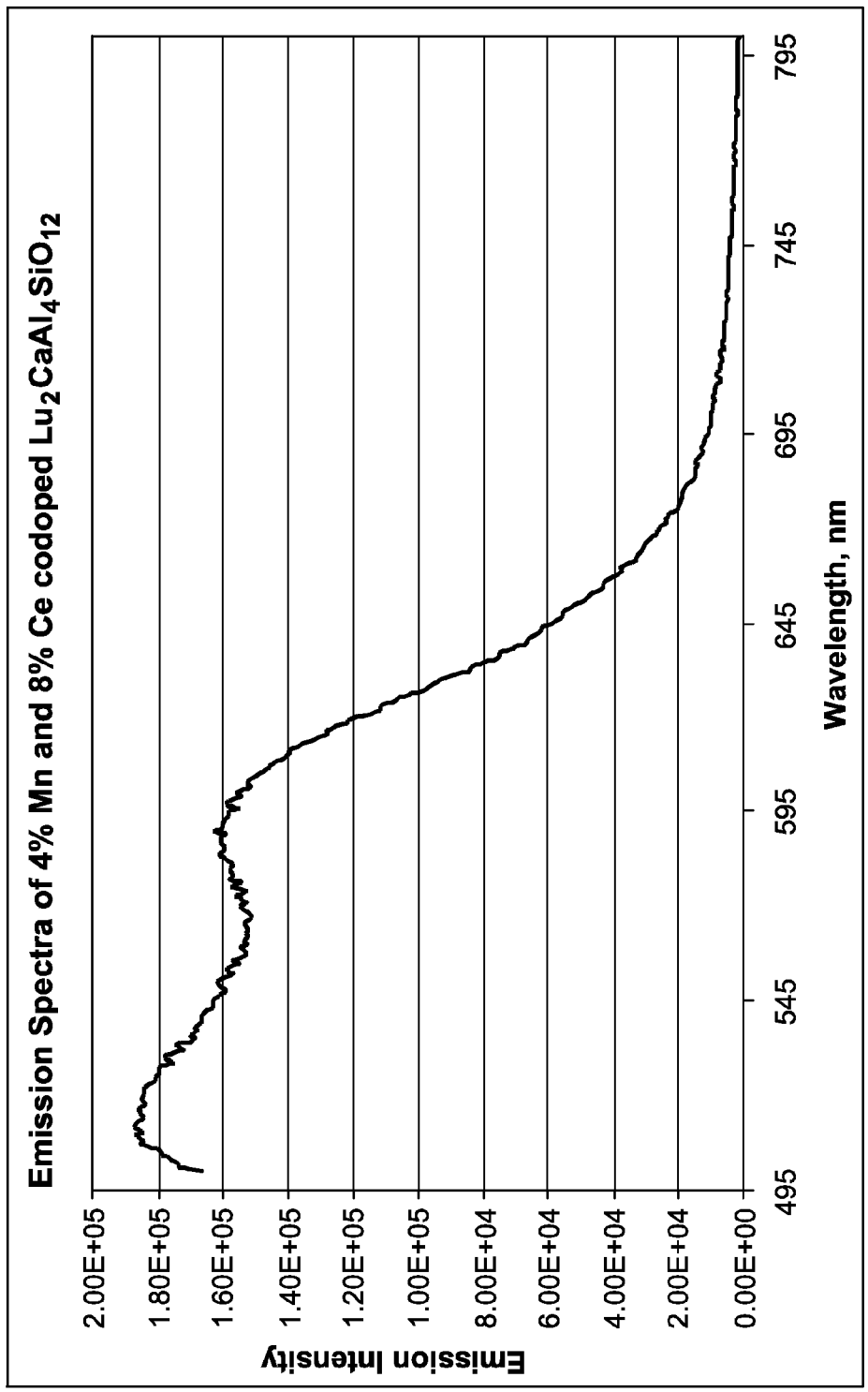
FIG. 4 shows the emission spectrum for $Lu_{2.0}Ce_{0.16}Ca_{0.84}Al_{3.84}Mn_{0.16}SiO_{12}$ when excited by blue radiation.

Luminescence Properties of $Lu_{2.0}Ce_{0.16}Ca_{0.84}Al_{3.84}Mn_{0.16}SiO_{12}$ FIG. 3 shows the excitation spectrum of Composition 1 ($Lu_{2.0}Ce_{0.16}Ca_{0.84}Al_{3.84}Mn_{0.16}SiO_{12}$). The excitation spectrum includes a relatively wide range from about 390 nm to about 510 nm. Composition 1 may therefore be excited by blue light (e.g., about 450 nm) typically used in conventional white-LEDs. FIG. 4 shows the emission spectrum for Composition 1 when excited by radiation of about 450 nm. The composition exhibits two wavelengths of peak emission at about 510 nm and about 600 nm.

Example 2.2

Effect of Doping Concentration on Emission Spectra

Figure 5:
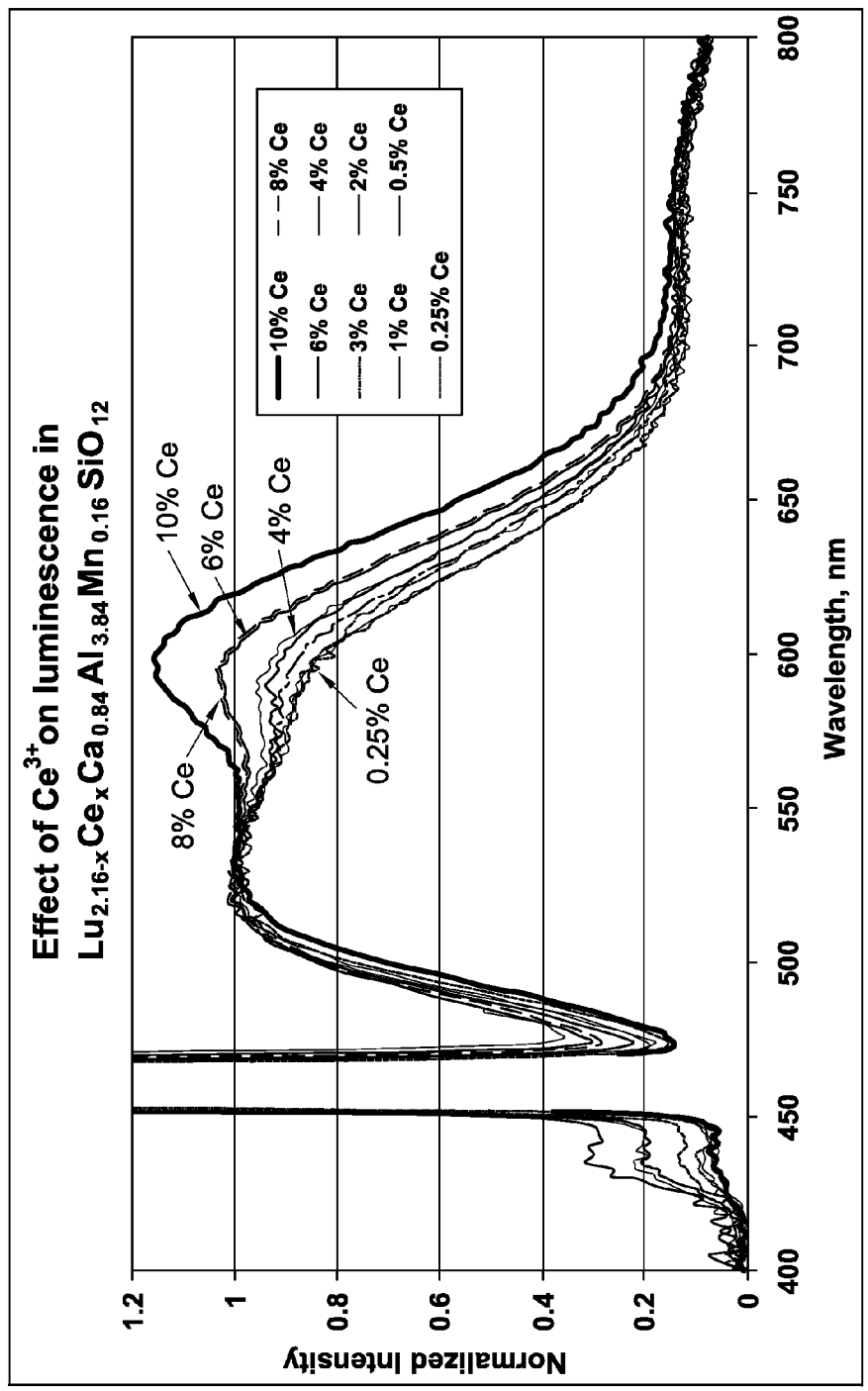
FIG. 5 shows the emission spectrum of different phosphor compositions having varying amounts of Ce when excited by blue radiation.
Figure 6:
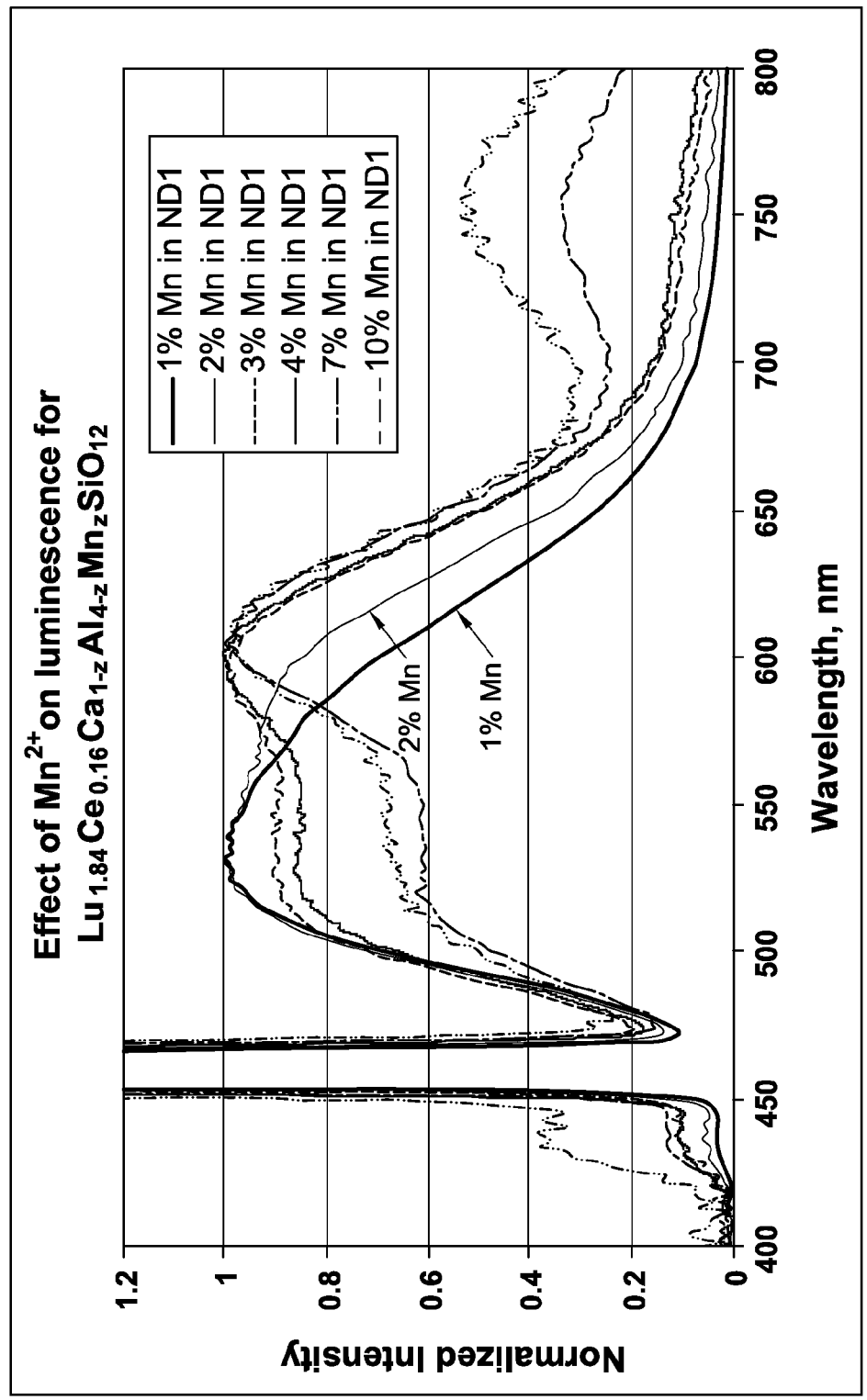
FIG. 6 shows the emission spectrum of different phosphor compositions having varying amounts of Mn when excited by blue radiation.

FIG. 5 shows the emission spectra of Compositions 1-9, where the variable x is varied from 0.05 to 0.20. The Ce percentages shown in FIG. 5 correlate with half the value of x. For example, 10% Ce is Composition 2 and therefore correlates with x being 0.20. The peak emission at about 600 nm increases with increasing Ce concentration. The peak also very slightly exhibits red-shifting with increasing Ce concentration. FIG. 6 shows the emission spectra of Compositions 1 and 10-15. The Mn percentages shown in FIG. 6 correlate with a quarter of the value of z. For example, 10% Mn is Composition 10 and therefore correlates with z being 0.40. When Mn is more than about 4%, an additional peak around 750 nm appears.

Example 2.3

Quantum Efficiencies of Phosphor Compositions

Figure 7:
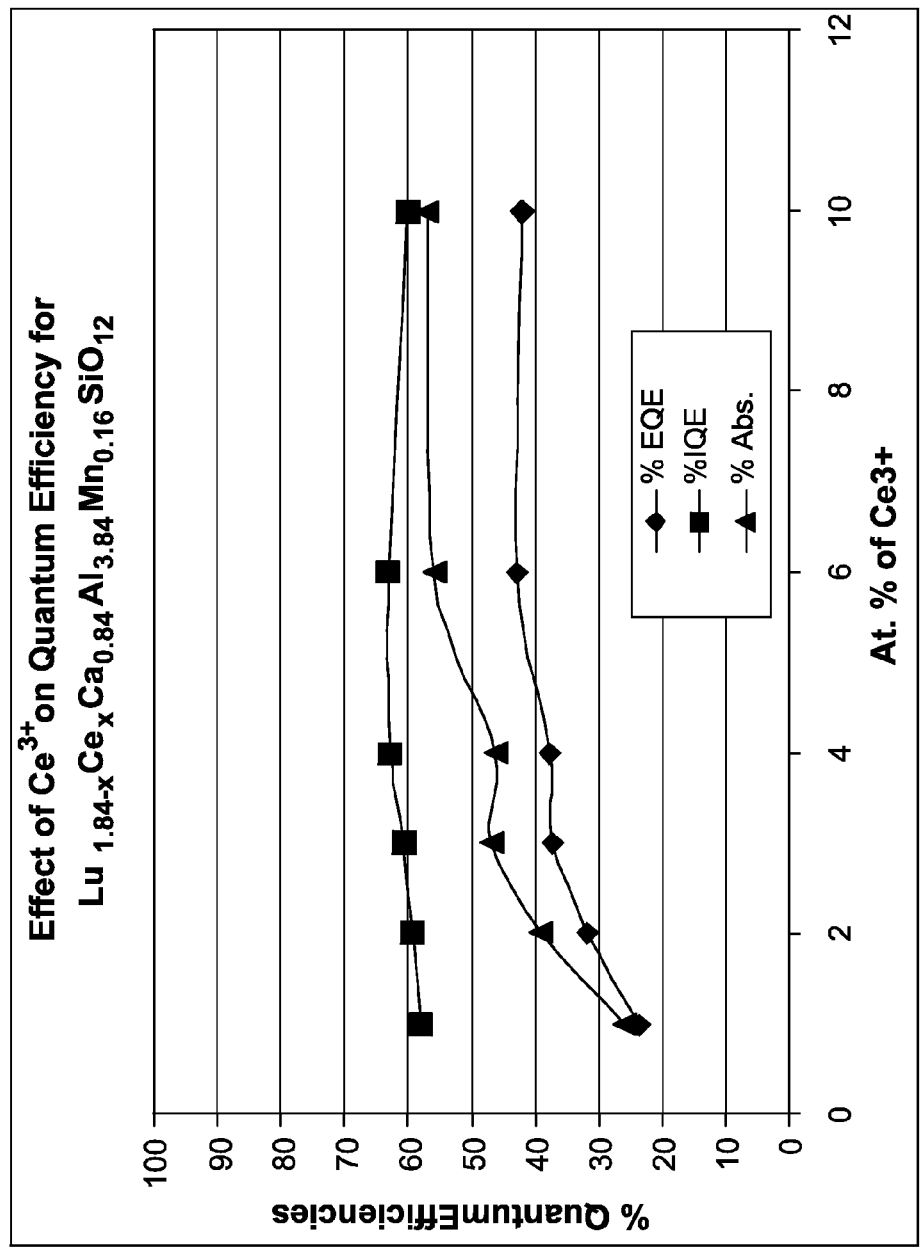
FIG. 7 shows the quantum efficiencies of different phosphor compositions having varying amounts of Ce when excited by blue radiation.
Figure 8:
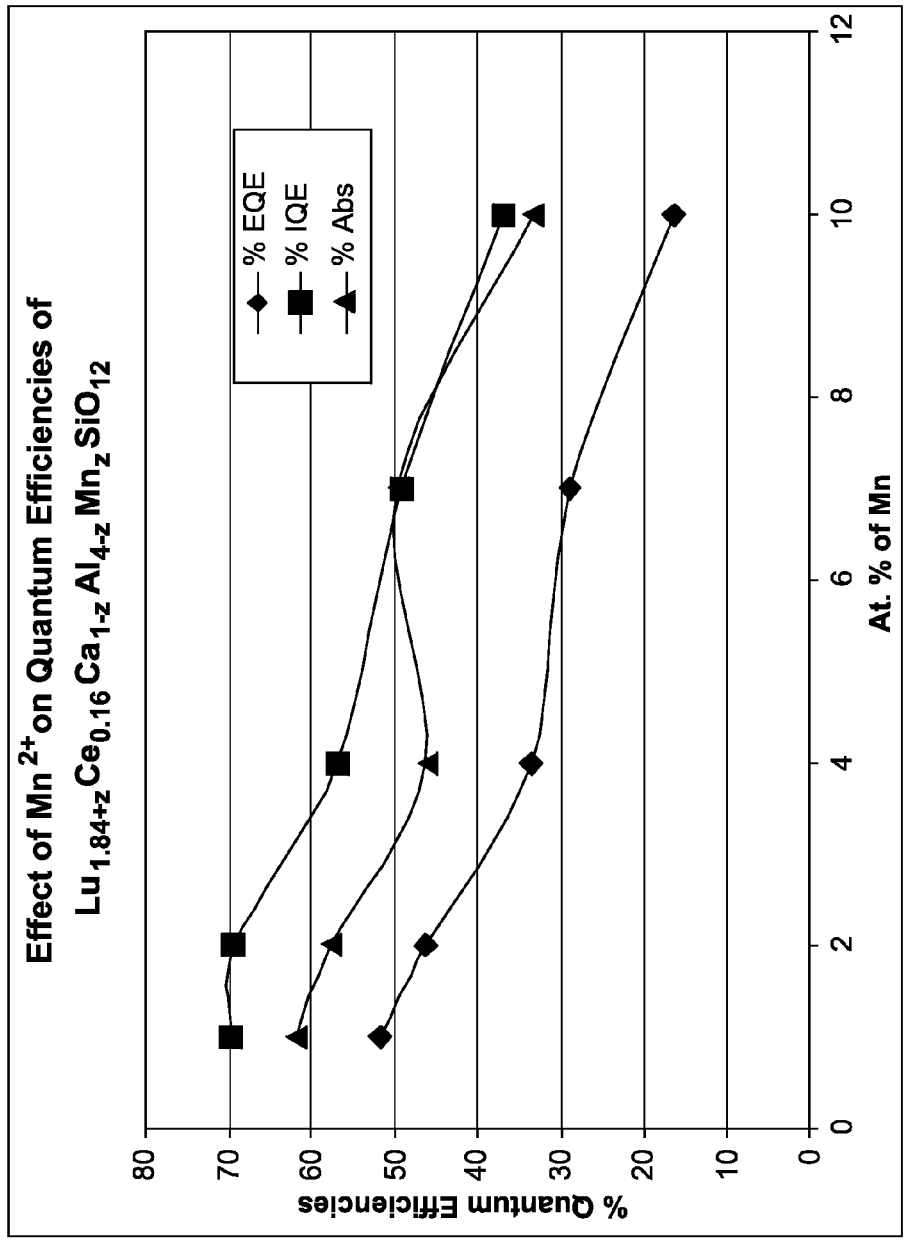
FIG. 8 shows the quantum efficiencies of different phosphor compositions having varying amounts of Mn when excited by blue radiation.

FIG. 7 shows the quantum efficiencies when varying the amount Ce. Compositions 2-7 were measured, where the percentages shown in FIG. 7 correlate with half the value of x. The IQE percentage remains relatively constant with increasing Ce concentrations, whereas the EQE and Abs. percentages exhibit an initial increase followed by a plateau at about 6% Ce (i.e., x is about 0.12). FIG. 8 compares the quantum efficiencies for various Mn concentrations. Compositions 1, 10, 11, 14 and 15 were measured, where the percentages shown in FIG. 8 correlate with a quarter of the value of z. The quantum efficiencies generally decrease with increasing amounts of Mn.

Example 2.4

Effect of Host on Luminescence

Figure 9:
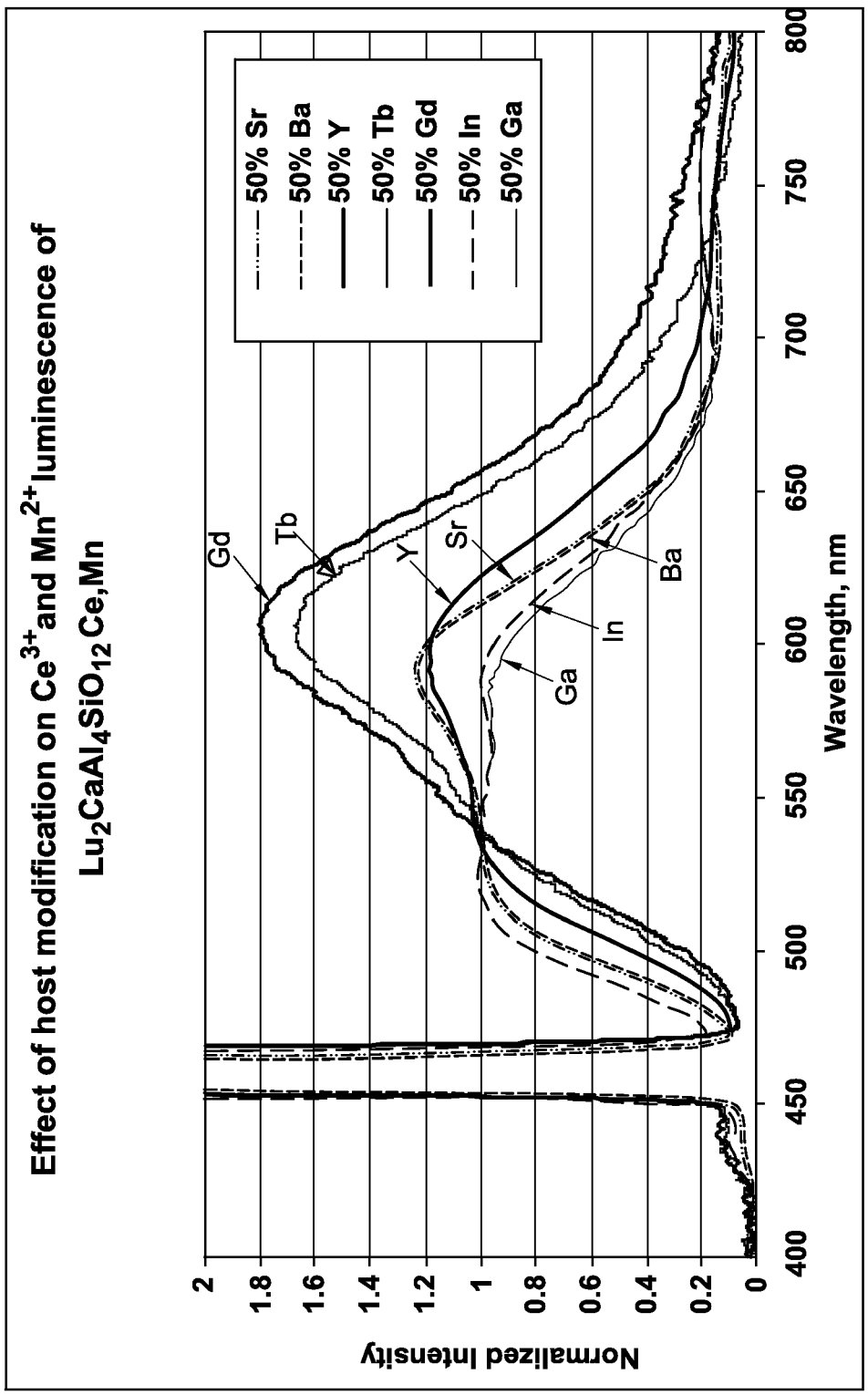
FIG. 9 shows the emission spectrum of different phosphor compositions having varying host lattices when excited by blue radiation.

FIG. 9 compares the emission spectra of various compositions with modified hosts. Compositions 16-22 are shown in FIG. 7. The IQE for Compositions 16-22 was 52.66%, 60.85%, 60.68%, 30.16%, 35.86%, 36.82%, and 49.74%, respectively. The peak emission at about 600 nm is enhanced when 50% Gd or Tb is included as a host; however the IQE was lower for these compositions. The IQE was about 60% for compositions including 50% Sr, Ba, and Y.

Example 2.5

Comparison of Phosphor Composition with Existing Phosphors

Figure 10:
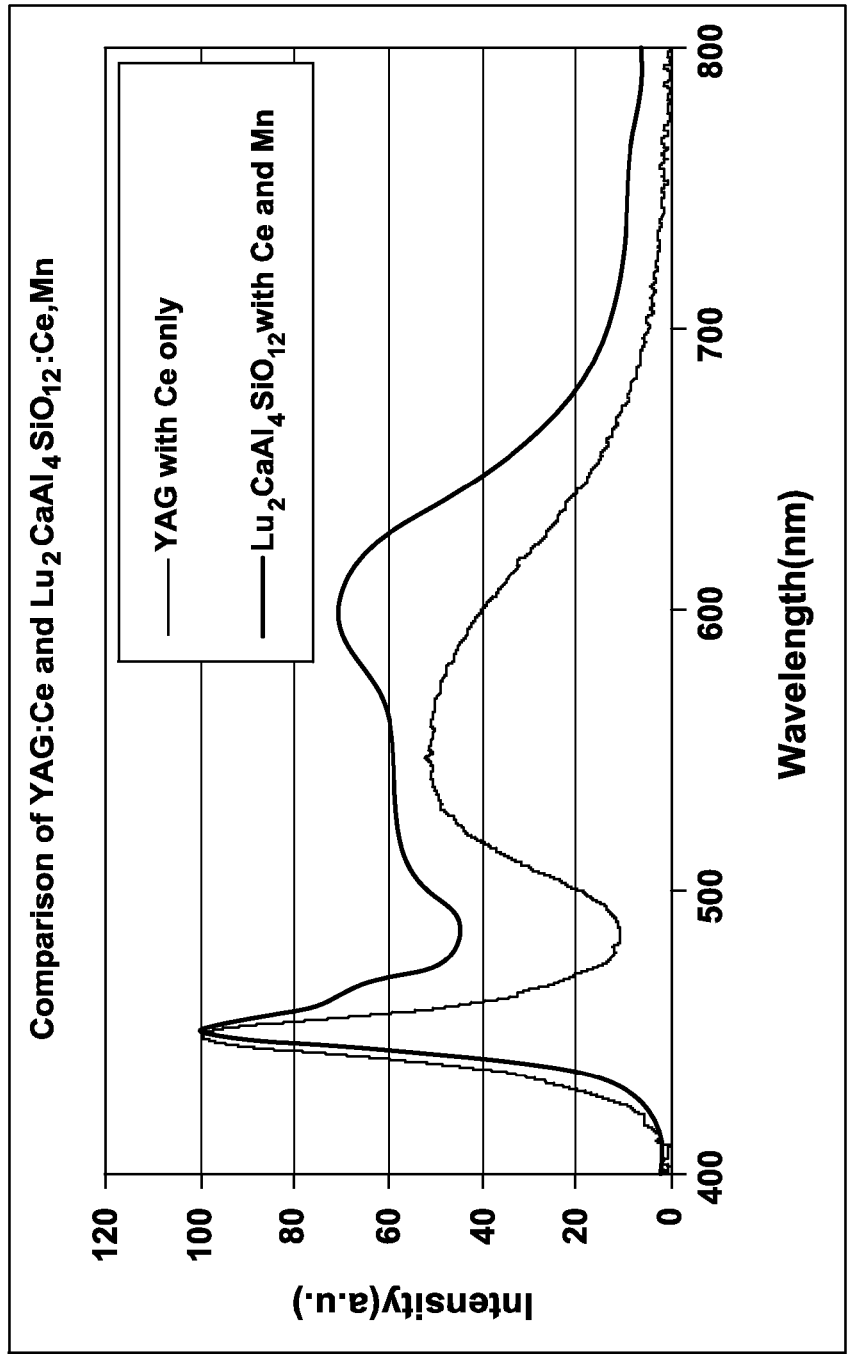
FIG. 10 shows the emission spectrum of $(Lu_{1.92}Ce_{0.08})Ca_{0.84}(Al_{0.96}Mn_{0.04})_4SiO_{12}$ and YAG:Ce when excited by blue radiation.

FIG. 10 compares the emission spectrum of commercial YAG:Ce phosphors (Yttrium Aluminum Garnet, Product No.: BYWO1A/P TCWO1AN, PhosphorTech Corp., Lithia Springs, Ga., USA) with Composition 1. The co-doped phosphor exhibits a wider emission spectrum compared to conventional YAG:Ce. As shown in TABLE 2, this spectrum provides an improved CRI of about 91, whereas YAG:Ce exhibits a CRI of 71. The x and y coordinates and color temperature are also provided in TABLE 2.

TABLE 2

| Phosphor | x | y | CT, K | Ra |
|---|---|---|---|---|
| $Ce^{3+}$ and $Mn^{2+}$ co-doped $Lu_2CaAl_4SiO_{12}$ | 0.3480 | 0.3528 | 4892 | 91 |
| $Ce^{3+}$ doped YAG | 0.3218 | 0.3426 | 5976 | 71.9 |

Example 3

Preparation of Raw Particles Using Inductively Coupled RF Thermal Plasma Pyrolysis Phosphor powders of $Lu_{2.0}Ce_{0.16}Ca_{0.84}Al_{3.84}Mn_{0.16}SiO_{12}$ were prepared using inductively coupled RF thermal plasma pyrolysis. 106.287 g $Lu(NO_3)_3.6H_2O$, 25.03 g $Ca(NO_3)_2.4H_2O$, 182.625 g $Al(NO_3)_3.9H_2O$, 5.79 g $Mn(NO_3)_2.6H_2O$, 8.686 g $Ce(NO_3)_3.6H_2O$ and 68.605 g of 22-25% Aminopropylsilane triol were dissolved along with 650 g Urea in about 720 mL of water, followed by ultrasonication for 30 min to prepare the transparent precursor solution. This precursor solution of 0.4 M was carried into a plasma reaction chamber via an atomization probe using a liquid pump.

All deposition experiments were conducted with an RF induction plasma torch (TEKNA Plasma System, Inc PL-35) operating at 3.3 MHz. For the deposition experiments, the chamber pressure was kept at around 25 kPa-35 kPa, and the RF generator plate power was in the range of 10-12 kW. Both the plate power and the deposition pressure are user-controlled parameters. Argon was introduced into the plasma torch as both the swirling sheath gas and the central plasma gas via the gas inlet ports. Sheath gas flow was maintained at 30 slm (standard liters per minute), while central gas flow was 10 slm.

Reactant injection was performed using a radial atomization probe (TEKNA Plasma System, Inc SDR-772). The probe was positioned at the center of the plasma plume during reactant injection. The reactants were fed into the plasma plume at a rate of 10 ml/min during deposition. Atomization of the liquid reactant was performed with Argon as atomizing gas delivered at a flow rate of 15 slm. The cooling water supply to the atomization probe was maintained at a flow rate of 4 slm and at a pressure of 1.2 MPa, as recommended by the manufacturer.

Example 4

Preparation of Sintered Ceramic Plates of $Lu_2CaAl_4SiO_{12}$:Ce, Mn

Sintered ceramic plates were made using $Lu_2CaAl_4SiO_{12}$:Ce, Mn phosphor nano-powders. 4 g of nano-powder prepared by the method described in Example 3, 0.21 g of poly (vinyl butyral-co-vinyl alcohol-co-vinyl acetate) (average Mw 90,000-120,000 powder, Sigma-Aldrich), 0.012 g of fumed silica powder (CAB-O-SIL® HS-5, Cabot Corporation), and 10 ml of methanol were well mixed by mortar and pestle until the mixture slurry solution became very smooth. By blowing hot air form a dryer and keep the pestle moving, methanol was completely removed, and then dry powders were obtained. By varying the loading quantities as 45.0, 47.5, 50.0, and 52.5 mg, the obtained dry powders were spread out into die set with 3 mm of diameter (Product #: 0012-6646, 3 mm KBr Die Set, International Crystal Laboratories, Inc) followed by applying a pressure of 4000 psi using hydraulic press. Then the obtained plates were sintered at 1500° C. for 5 hrs (heating rate is 5° C./min) using a tube furnace, Model No. GSL 1800X (MTI Corporation, Richmond, Calif., USA) under a reducing atmosphere (e.g., 3% or 4% Hydrogen-97% or 96% nitrogen atmosphere) or vacuum condition. The crystalline phase of all ceramic plate samples was determined as $Lu_2CaAl_4SiO_{12}$ garnet by XRD.

Example 5

Optical Measurement of Ceramic Plates

The four ceramic plates from Example 5 were mounted onto a blue LED tip and 10 mA DC at 2.9V was applied to the LED. The white light spectrum was acquired for each sample using a photo detector together with an integrating sphere (MCPD 7000, Otsuka Electronics, Inc). In order to remove any air gaps between ceramic plate and LED tip, paraffin oil was filled into the gap. The identical LED tip and operation conditions were employed for each measurement.

Figure 11:
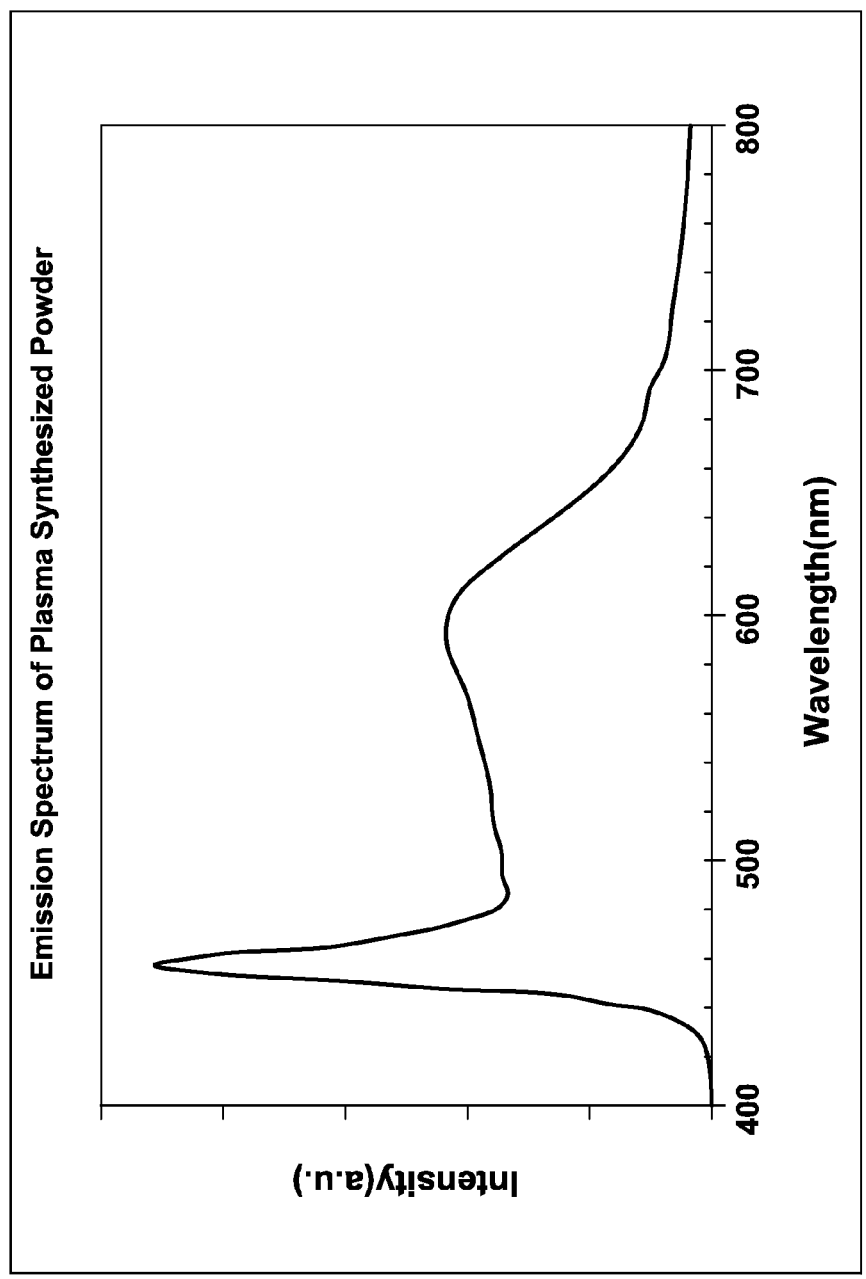
FIG. 11 shows the emission spectrum of a sintered ceramic plate having $Lu_{2.0}Ce_{0.16}Ca_{0.84}Al_{3.84}Mn_{0.16}SiO_{12}$ when excited by blue radiation.
Figure 12:
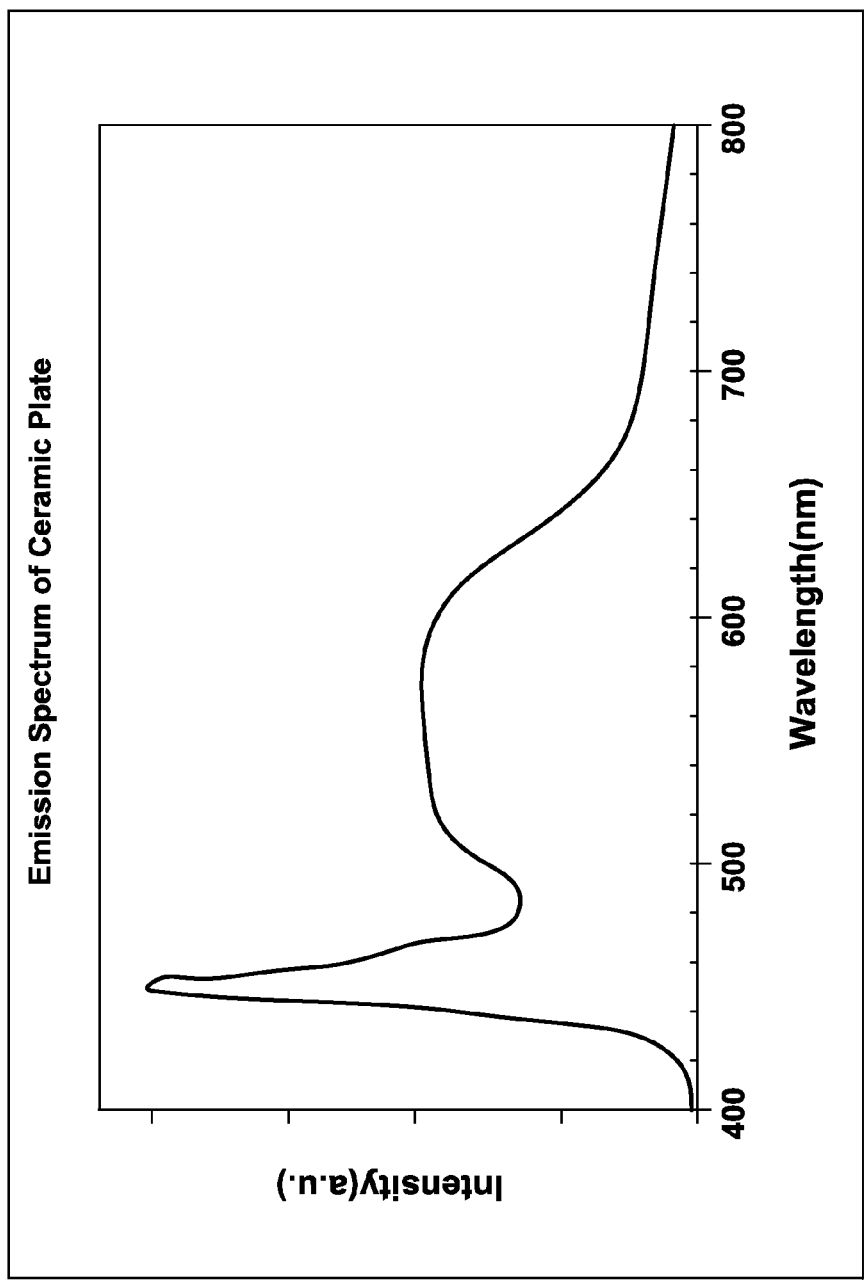
FIG. 12 shows the emission spectrum of a plasma synthesized powder having $Lu_{2.0}Ce_{0.16}Ca_{0.84}Al_{3.84}Mn_{0.16}SiO_{12}$ when excited by blue radiation.

From these emission spectra, CIE color chromaticity (x, y) was calculated. TABLE 3 includes the results for the ceramic plate along with the same co-doped phosphor powder in Example 2.5. The emission spectra for the ceramic plate is shown in FIG. 11. For comparison, FIG. 12 shows the emission spectra for the phosphor powder composition from Example 3.

TABLE 3

|  | Ceramic Plate | Powder |
| --- | --- | --- |
| Chromaticity (x, y) | (0.329, 0.339) | (0.320, 0.337) |
| CCT | 5640K | 6070K |
| CRI | 87 | 87 |
| R9 | 40 | 21 |

In addition, total light transmittance data of one of the samples was also measured using a similar measurement system as described in U.S. Patent Publication No. 2009/0212697 (MCPD 7000, Otsuka Electronics, Inc, Xe lamp, monochromator, and integrating sphere equipped). Photoluminescent spectrum of the sample was excited by a blue light (the peak wavelength was about 460 nm) from a monochromator that was acquired using the same photo detector. The peak wavelength of the $Lu_2CaAl_4SiO_{12}$:Ce, Mn ceramic plate was around 530 nm, and the total light transmittance at 530 nm was about 42%.

What is claimed is:

1. A phosphor composition comprising a compound represented by the formula $(RE_{2-x+y}Ce_xAk_{1-y})(MG_{4-z-r}Si_rMn_z)(Si_{1-e}P_e)O_{12-r}N_r$, wherein:
   RE comprises at least one rare earth metal;
   Ak comprises at least one alkaline earth metal;
   MG comprises at least one main group element;
   x is greater than 0 and less than or equal to 0.2;
   y is less than 1;
   z is greater than 0 and less than or equal to 0.8;
   e is about 0, or less than or equal to 0.16;
   r is about 0, or less than or equal to 1; and
   z is about the sum of e and y.

2. The phosphor composition of claim 1, wherein MG is selected from the group consisting of Al, Sc, In, Ga, B, Si and combinations thereof.

3. The phosphor composition of claim 2, wherein MG is Al.

4. The phosphor composition of claim 1, wherein RE is selected from the group consisting of Lu, Y, Gd, Tb, Sm, Pr and combinations thereof.

5. The phosphor composition of claim 4, wherein RE is Lu.

6. The phosphor composition of claim 1, wherein Ak is selected from the group consisting of Mg, Ca, Ba, Sr and combinations thereof.

7. The phosphor composition of claim 6, wherein Ak is Ca.

8. The phosphor composition of claim 1, the compound is represented by the formula $(Lu_{2.16-x}Ce_x)Ca_{0.84}Al_{3.84}Mn_{0.16}SiO_{12}$, wherein x is greater than 0.0025 and less than 0.2.

9. The phosphor composition of claim 8, wherein x is about 0.16.

10. The phosphor composition of claim 1, wherein the compound is represented by the formula $(Lu_{1.84+z}Ce_{0.16})Ca_{1-z}(Al_{4-z}Mn_z)SiO_{12}$, wherein z is greater than 0 and less than 0.8.

11. The phosphor composition of claim 10, wherein z is about 0.02 or about 0.04.

12. The phosphor composition of claim 1, wherein the compound is represented by the formula $(Lu_{1.84}Ce_{0.16})Ca(Al_{4-z}Mn_z)(Si_{1-z}P_z)O_{12}$, wherein z is at least about 0.01 and less than about 0.16.

13. The phosphor composition of claim 12, wherein z is about 0.02 or about 0.04.

14. The phosphor composition of claim 1, wherein the composition is represented by the formula selected from the group consisting of $(Lu_{1.86}Ce_{0.16}Ca_{0.98})(Al_{3.98}Mn_{0.02})SiO_{12}$, $(Lu_{1.88}Ce_{0.16}Ca_{0.96})(Al_{3.96}Mn_{0.04})SiO_{12}$, $(Lu_{1.84}Ce_{0.16})Ca(Al_{3.98}Mn_{0.02})(Si_{0.98}P_{0.02})SiO_{12}$ and $(Lu_{1.84}Ce_{0.16})Ca(Al_{3.96}Mn_{0.04})(Si_{0.96}P_{0.04})O_{12}$.

15. The phosphor composition of claim 1, wherein the compound is represent by the formula $(Lu_{2-x+z}Ce_xCa_{1-z})(Al_{4-z-r}Si_rMn_z)SiO_{12-r}N_r$, wherein:
   x is greater than about 0.001 and less than about 0.4;
   z is greater than about 0.001 and less than about 0.4; and
   r is greater than about 0.2 and less than or equal to about 1.

16. The phosphor composition of claim 15, wherein the compound is represented by the formula selected from the group consisting of $(Lu_{2.0}Ce_{0.16}Ca_{0.84})(Al_{3.44}Si_{0.40}Mn_{0.16})SiO_{11.6}N_{0.40}$ and $(Lu_{2.0}Ce_{0.16}Ca_{0.84})(Al_{2.84}Si_{1.0}Mn_{0.16})SiO_{11}N_1$.

17. The phosphor composition of claim 1, wherein the phosphor composition is a sintered ceramic plate.

18. The phosphor composition of claim 1, wherein the phosphor composition comprises a particulate that includes the compound.

19. A lighting apparatus comprising:
   a light source configured to emit blue radiation; and
   the phosphor composition of claim 1, wherein the phosphor composition is configured to receive at a least a portion of the blue radiation.

20. A method of producing light comprising exposing the phosphor composition of claim 1 to a blue radiation.

* * * * *

UNITED STATES PATENT AND TRADEMARK OFFICE
CERTIFICATE OF CORRECTION

| | | |
|---|---|---|
| PATENT NO. | : 8,207,663 B2 | Page 1 of 1 |
| APPLICATION NO. | : 13/176660 | |
| DATED | : June 26, 2012 | |
| INVENTOR(S) | : Sambandan et al. | |

It is certified that error appears in the above-identified patent and that said Letters Patent is hereby corrected as shown below:

On Title Page 2 item 56 at line 6, Under Other Publications, change "Sampls" to --Samples--.

On Title Page 2 item 56 at line 18, Under Other Publications, change "Photolumnescence" to --Photoluminescence--.

In column 1 at line 36, Change "e.g," to --e.g.,--.

In column 6 at line 4, Change "$RE_{2-x-y}$" to --$RE_{2-x+y}$--.

In column 6 at line 10 (approx.), Change "$Lu_{0.84}$" to --$Lu_{1.84}$--.

In column 6 at line 21, Change "$SiO_{116}$" to --$SiO_{11.6}$--.

In column 7 at line 3, Change "$SiO_{11.6}$" to --$SiO_{11}$--.

In column 9 at line 31, Change "covert" to --convert--.

In column 17 at line 28, Change "BYWO1A/P TCWO1AN," to --BYWO1A/PTCWO1AN,--.

In column 17 at line 51, Change "$Lu(NO_3)_{3.6}H2O$," to --$Lu(NO_3)_3.6H2O$,--.

In column 20 at line 20, In Claim 14, change "$SiO_{12}$" to --$O_{12}$--.

Signed and Sealed this
Eighth Day of January, 2013

David J. Kappos
*Director of the United States Patent and Trademark Office*